(12) United States Patent
Torii

(10) Patent No.: US 8,897,079 B2
(45) Date of Patent: Nov. 25, 2014

(54) NON-VOLATILE SEMICONDUCTOR MEMORY WITH BIT LINE HIERARCHY

(75) Inventor: Satoshi Torii, Kuwana (JP)

(73) Assignee: Fujitsu Semiconductor Limited, Yokohama (JP)

( * ) Notice: Subject to any disclaimer, the term of this patent is extended or adjusted under 35 U.S.C. 154(b) by 346 days.

(21) Appl. No.: 13/426,463

(22) Filed: Mar. 21, 2012

(65) Prior Publication Data

US 2012/0243335 A1   Sep. 27, 2012

(30) Foreign Application Priority Data

Mar. 22, 2011   (JP) .................................. 2011-062293

(51) Int. Cl.
   *G11C 16/06* (2006.01)
   *G11C 16/04* (2006.01)
   *G11C 16/34* (2006.01)

(52) U.S. Cl.
   CPC .......... *G11C 16/0416* (2013.01); *G11C 16/349* (2013.01); *G11C 16/06* (2013.01); *G11C 16/0483* (2013.01)
   USPC .................................................. 365/185.25

(58) Field of Classification Search
   CPC ...................................................... G11C 16/06
   USPC ....................................... 365/185.01–185.33
   See application file for complete search history.

(56) References Cited

U.S. PATENT DOCUMENTS

| | | | |
|---|---|---|---|
| 6,621,744 B2 * | 9/2003 | Kojima | 365/185.23 |
| 8,107,300 B2 | 1/2012 | Ogura et al. | |
| 2002/0167853 A1 * | 11/2002 | Kojima | 365/202 |
| 2005/0258474 A1 | 11/2005 | Tanaka et al. | |
| 2006/0220100 A1 | 10/2006 | Tanaka et al. | |
| 2009/0010072 A1 | 1/2009 | Tanaka et al. | |
| 2010/0157689 A1 | 6/2010 | Tanaka et al. | |
| 2011/0309428 A1 | 12/2011 | Tanaka et al. | |
| 2012/0147686 A1 * | 6/2012 | Takayama et al. | 365/203 |

FOREIGN PATENT DOCUMENTS

| | | |
|---|---|---|
| JP | 5-243531 A | 9/1993 |
| JP | 2008-192254 A | 8/2008 |
| JP | 4317745 B2 | 8/2009 |
| WO | WO 03/012878 A1 | 2/2003 |

\* cited by examiner

*Primary Examiner* — Harry W Byrne
(74) *Attorney, Agent, or Firm* — Arent Fox LLP

(57) ABSTRACT

Local bit lines (LBL) are respectively provided for a plurality of sectors, corresponding to each of the global bit lines (GBL). Sector select transistors connect a LBL to a GBL ector select lines control the on/off state of the sector select transistors for the corresponding sectors. A plurality of word lines (WL) intersect the local bit lines. Memory cells are located at the intersections between the LBL and the WL. Each memory cell connects a source line with the corresponding LBL and includes an n-channel transistor that is turned on/off by the corresponding WL. A precharge voltage is applied to a charging line. Charging transistors connect the LBL to the charging line. A charging gate line controls the on/off state of the charging transistors.

10 Claims, 30 Drawing Sheets

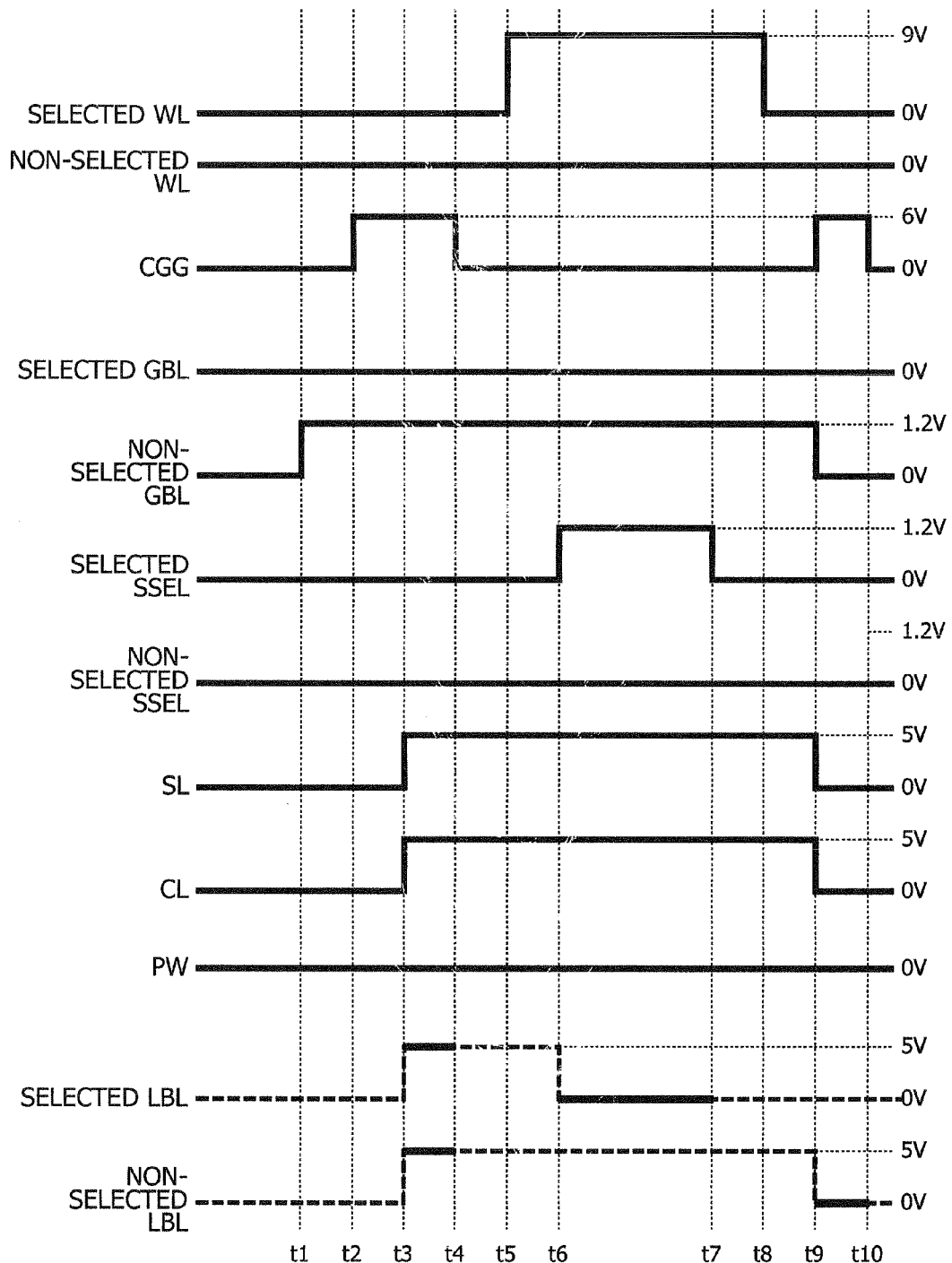

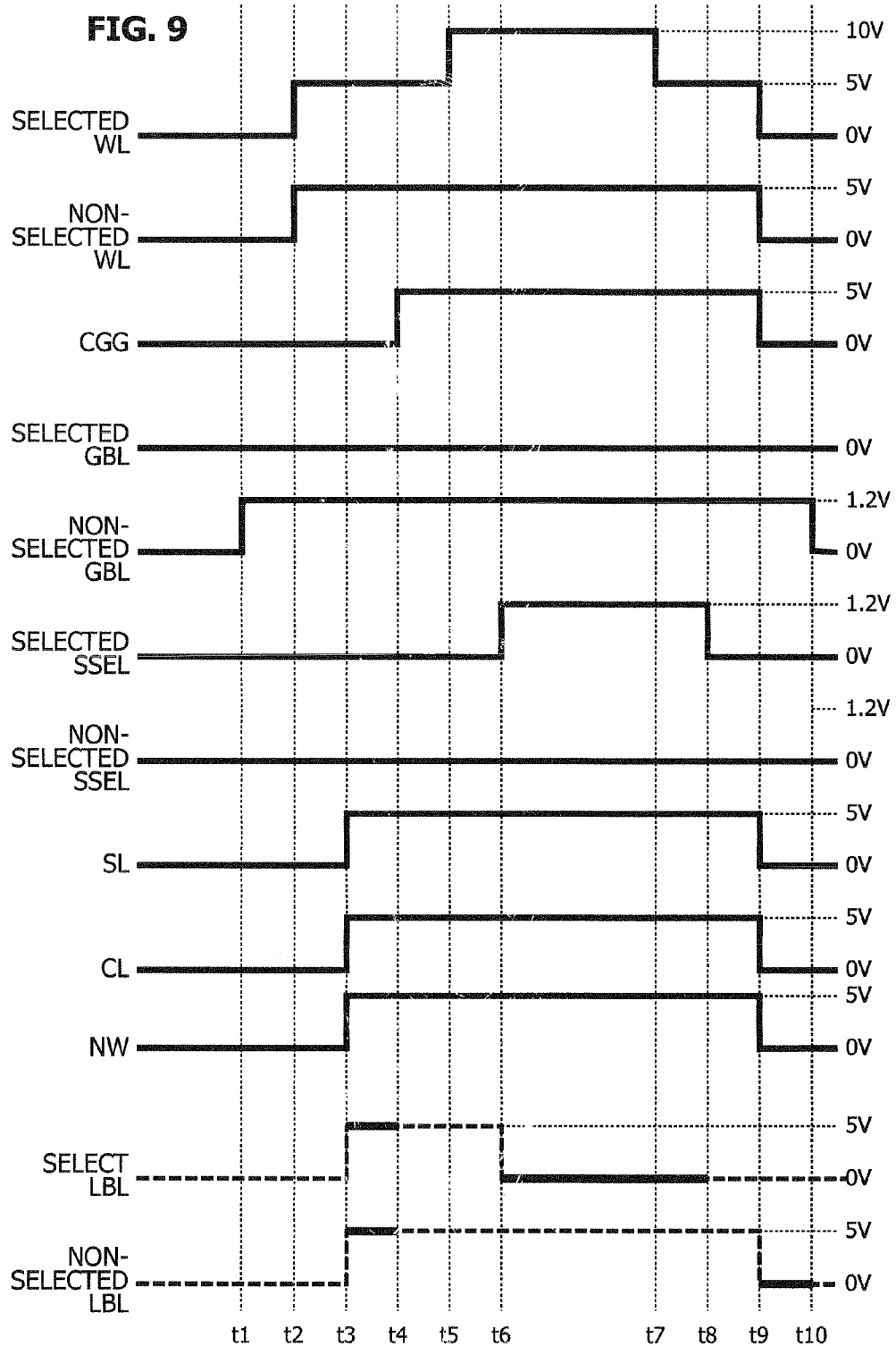

NON-VOLATILE SEMICONDUCTOR MEMORY WITH BIT LINE HIERARCHY

CROSS REFERENCE TO RELATED APPLICATIONS

This application is based upon and claims the benefit of priority of the prior Japanese Patent Application No. 2011-62293, filed on Mar. 22, 2011, the entire contents of which are incorporated herein by reference.

FIELD

The embodiments of the invention relate to non-volatile semiconductor memories comprising a hierarchical bit line structure in which a plurality of local bit lines are connected to each of global bit lines.

BACKGROUND

To achieve a larger memory capacity in a smaller chip area, some NOR type non-volatile semiconductor memory devices have a hierarchical bit line structure in which a plurality of local bit lines are connected to each of global bit lines. Described below is the working mechanism of a typical conventional n-channel floating gate type flash memory with a bit line hierarchy.

To write data, 5V, 0V, and 9V are applied to the local bit line (drain), source line, and word line (gate) for the selected cell. Electrons accelerated between the source and the drain are injected into the floating gate to cause a negative voltage, thereby decreasing the effective gate voltage applied to the gate (control gate). This increases the required gate voltage for inducing an inversion layer at the channel surface, leading to an increased threshold voltage of the memory transistor.

To erase data, the local bit line and the source line are brought into a floating state, and 9V and −9V are applied to the p-type well containing the memory transistor and the word line (gate), respectively. The negative voltage is removed as the electrons stored in the floating gate are extracted into the substrate. The threshold voltage of the memory transistor decreases, and becomes lower than that in the state when electrons were stored.

To read data, 0.9V, 0V, and 5V are applied to the local bit line (drain), source line, and word line (gate) for the selected cell. No electric current flows when the memory transistor is in written state, and a current flows when it is in erased state.

High-voltage transistors are used in the bit line control circuit since application of a voltage of 5 V to the local bit line is required to write data. Accordingly, the bit line control circuit occupies a relatively large area in the chip, restricting the reduction in chip size. To read data, on the other hand, 0.9 V is applied to the local bit line. The high-voltage transistors in the bit line control circuit are driven at a relatively low voltage, making it difficult to increase the data read speed.

High-voltage transistors are commonly used in column decoders (for instance, see Japanese Patent No. 4317745, Japanese Unexamined Patent Publication (Kokai) No. HEI-5-243531).

In a p-channel floating gate type flash memory, the drain of the memory transistor in a non-selected memory cell is in a floating state during a write process. Unexpected data writing (program disturbance) can take place if the electric potential in the drain in a non-selected memory cell comes closer to the drain voltage of the selected memory cell due to capacitive coupling with the substrate (for instance, see Japanese Unexamined Patent Publication (Kokai) No. 2008-192254).

SUMMARY

One aspect of the invention provides a non-volatile semiconductor memory including: a plurality of global bit lines; a plurality of local bit lines provided for each of the global bit lines, each of the local bit lines defining a sector; a sector select transistor provided for each of the sectors, connecting the corresponding local bit line with the corresponding global bit line; sector select lines respectively provided for the corresponding sectors, controlling on/off state of the sector select transistors; a plurality of word lines intersecting the local bit lines; a source line; memory cells located at intersections between the local bit lines and the word lines, each of the memory cells connecting the source line with the corresponding local bit line, and containing an n-channel memory transistor that is turned on/off by the corresponding word line; a charging line to which a precharge voltage is applied; charging transistors respectively provided for the corresponding local bit lines and connecting the corresponding local bit lines with the charging line; charging gate lines controlling on/off state of the charging transistors; and control circuit controlling electric signals applied to the global bit lines, the sector select lines, the word lines, the source line, the charging line, and the charging gate lines.

Another aspect of the invention provides anon-volatile semiconductor memory including a plurality of global bit lines a plurality of local bit lines provided for each of the global bit lines, each of the local bit lines defining a sector; a sector select transistor provided for each of the sectors, connecting the corresponding local bit line with the corresponding global bit line; sector select lines respectively provided for the corresponding sectors, controlling on/off state of the sector select transistors; a plurality of row select lines intersecting the local bit lines; a source line; memory cells located at intersections between the local bit lines and the row select lines, each of the memory cells connecting the source line with the corresponding local bit line, and being controlled its conductivity by the corresponding row select line; a charging line to which a precharge voltage is applied; charging transistors respectively provided for the corresponding local bit lines and connecting the corresponding local bit lines with the charging line; charging gate lines controlling on/off state of the charging transistors; and control circuit controlling electric signals applied to the global bit lines, the sector select lines, the word lines, the source line, the charging line, and the charging gate lines; wherein the control circuit, during the write process, applies the precharge voltage to the charging line, to turn on the charging transistors, and apply the precharge voltage to the local bit line, followed by turning on the sector select transistor connected to the local bit line corresponding to the memory cell where datum is to be written to discharge the local bit line.

The object and advantages of the invention will be realized and attained by means of the elements and combinations particularly pointed out in the claims.

It is to be understood that both the foregoing general description and the following detailed description are exemplary and are not restrictive of the invention, as claimed.

BRIEF DESCRIPTION OF DRAWINGS

FIG. 2 is a timing chart for write operation of the non-volatile semiconductor memory according to Embodiment 1.

FIG. 9 is a timing chart for write operation of the non-volatile semiconductor memory according to Embodiment 2.

DESCRIPTION OF EMBODIMENTS

Embodiment 1

Figure 1:
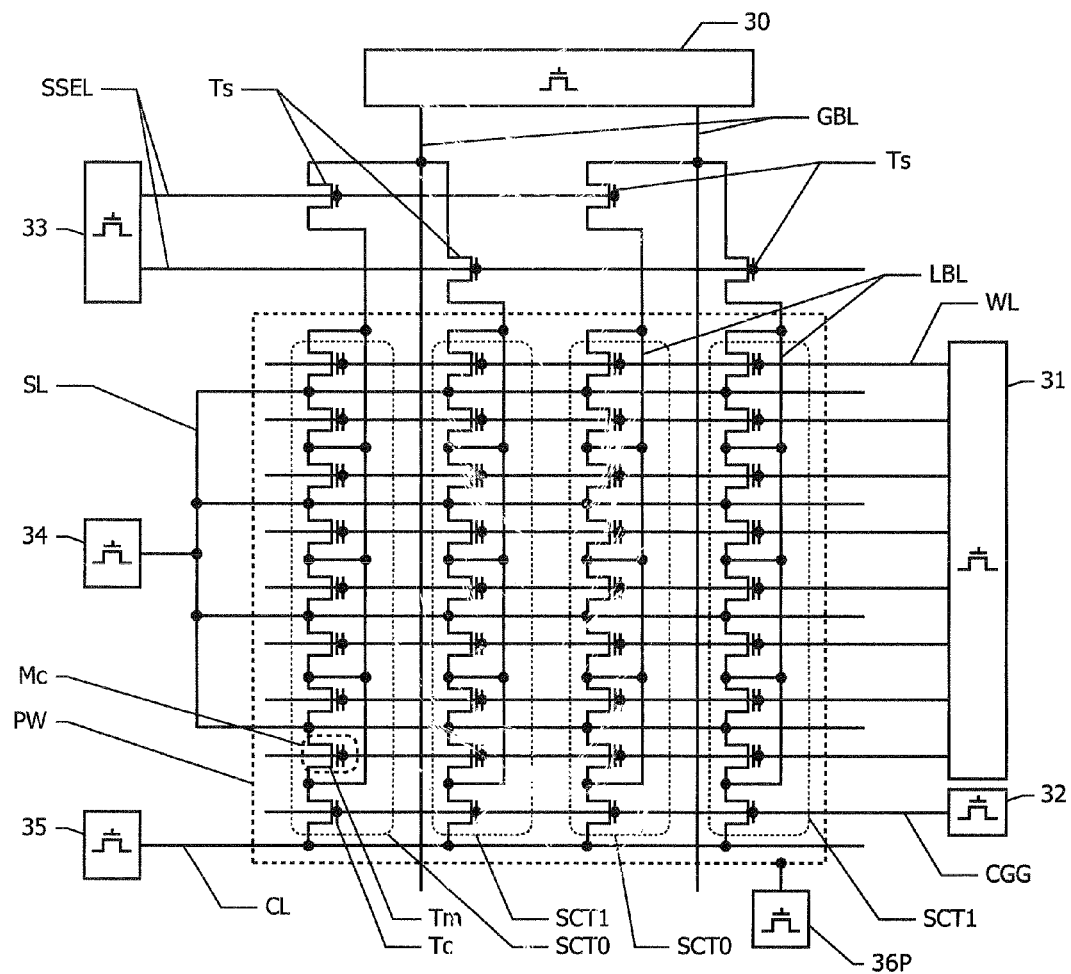
FIG. 1 is an equivalent circuit diagram of the non-volatile semiconductor memory according to Embodiment 1.

FIG. 1 is an equivalent circuit diagram of a non-volatile semiconductor memory according to Embodiment 1. A plurality of global bit lines GBL extend in vertical direction in FIG. 1. A plurality of word lines (row select lines) WL, a plurality of source lines SL, and a plurality of sector select line SSEL extend in horizontal direction in FIG. 1. Further, a charging line CL and a charging gate line CGG extend in horizontal direction in FIG. 1. Two local bit lines LBL are connected to each of the global bit lines GBL, and extend in vertical direction in FIG. 1. One of the two local bit lines LBL constitutes sector 0 (SCT0), and another of the two local bit lines constitutes sector 1 (SCT1). The number of sectors connected to one global bit line is not limited to two. Three or more sectors may be provided. Bit line control circuit 30 applies write data signals to the global bit line GBL. The bit line control circuit 30 contains a sense amplifier which detects electric current flowing in the global bit line GBL.

A plurality of local bit lines LBL are connected to each global bit line GBL through respective sector select transistors Ts. Each sector select transistor Ts is, for instance, formed of an n-channel MOS transistor.

Sector select transistors Ts are respectively connected to the local bit lines LBL's. Each of the sector select lines SSEL is connected to gate electrodes of the sector select transistors Ts of the assigned sector (SCT0 or SCT1). Sector control circuit 33 applies a sector select signal to a selected sector select line SSEL. The sector select signal controls on/off state of the sector select transistor Ts.

A plurality of word lines WL intersect a plurality of local bit lines LBL to form matrix-like intersections. A memory cell Mc is connected at each intersection. Thus, the memory cells are arranged in a matrix (rows and columns). Each memory cell Mc may be formed of a memory transistor Tm. The memory transistor Tm may be, for instance, an n-channel floating gate type non-volatile memory transistor. In each sector, a plurality of memory transistors are connected in series. The memory transistor Tm has a source connected to a source line SL, a control gate connected to a related word line WL, and a drain connected to a related local bit line LBL.

Word line control circuit (row select circuit) 31 applies a word line select signal to a selected word line WL. Source lines SL are connected in common and the common source line is connected to a source line control circuit 34. The source line control circuit 34 applies a source voltage, which is either a relatively low voltage or a relatively high voltage, to commonly connected source line SL. The relatively low voltage is, for instance, 0 V, and the relatively high voltage is, for instance, 5 V. The source line control circuit 34 and the source line SL may be collectively referred to as source voltage application circuit.

Each of the local bit lines LBL is connected to a related charging transistor Tc. Each charging transistor Tc may be formed of an n-channel MOS transistor. The memory transistors Tm and the charging transistors Tc are located in a same p-type well PW. The p-type well voltage control circuit 36P applies a well voltage to the p-type well PW.

The local bit lines LBL are connected to a charging line CL via the charging transistors Tc. The charging line CL is connected to a charging line control circuit 35. The charging line control circuit 35 applies a precharge voltage to the charging line CL. The gates of the charging transistors Tc are connected to a single charging gate line CGG which is connected to charging gate control circuit 32. The charging gate control circuit 32 applies charging control signal to the gates of the charging transistors Tc through the charging gate line CGG. The charging control signal controls an/off state of the charging transistors Tc.

The bit line control circuit 30, the word line control circuit 31, the charging gate line control circuit 32, the sector control circuit 33, the source line control circuit 34, and the charging line control circuit 35 include MOS transistors formed on a single substrate where the memory cells Mc are also formed.

The working mechanism of the non-volatile semiconductor memory according to Embodiment 1 will be described below with reference to FIG. 2, FIG. 3A to 3G, and FIG. 4.

FIG. 2 is a timing chart illustrating the write operation. In the standby state, 0 V is applied to the word lines WL, charging gate line CGG, global bit lines GBL, sector select lines SSEL, source lines SL, charging line CL, and p-type well PW. The local bit lines LBL are in the floating state. In FIG. 2, the durations of the floating state are illustrated by broken lines.

At time t1, data signal is applied to the global bit line GBL. Data signal of a relatively low voltage, for instance 0 V, is applied to the global bit line GBL connected to the memory cell Mc (selected memory cell) in which data is to be written. Data signal of a relatively high voltage, for instance 1.2 V, is applied to other global bit lines GBL. The global bit line GBL to which a voltage of 0 V is applied is referred to as the selected global bit line, and the global bit lines GBL to which a voltage of 1.2 V is applied are referred to as the non-selected global bit lines.

Figure 3A:
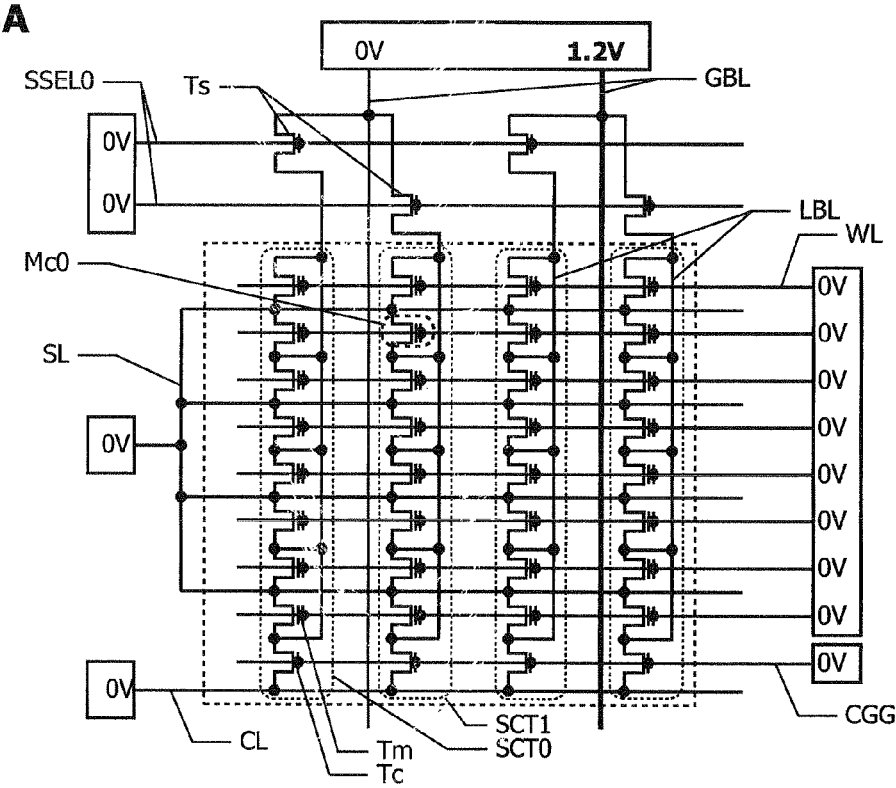
FIG. 3A-3G are equivalent circuit diagrams illustrating the voltage application state during a write process of the non-volatile semiconductor memory according to Embodiment 1.

In FIG. 3A, 0 V is applied to the left global bit line GBL and 1.2 V is applied to the right global bit line GBL. Described below is a case where datum is written in the memory cell Mc0 that is on the second row in the sector 1 (SCT1) connected to the global bit line GBL to which 0 V is applied.

Figure 3B:
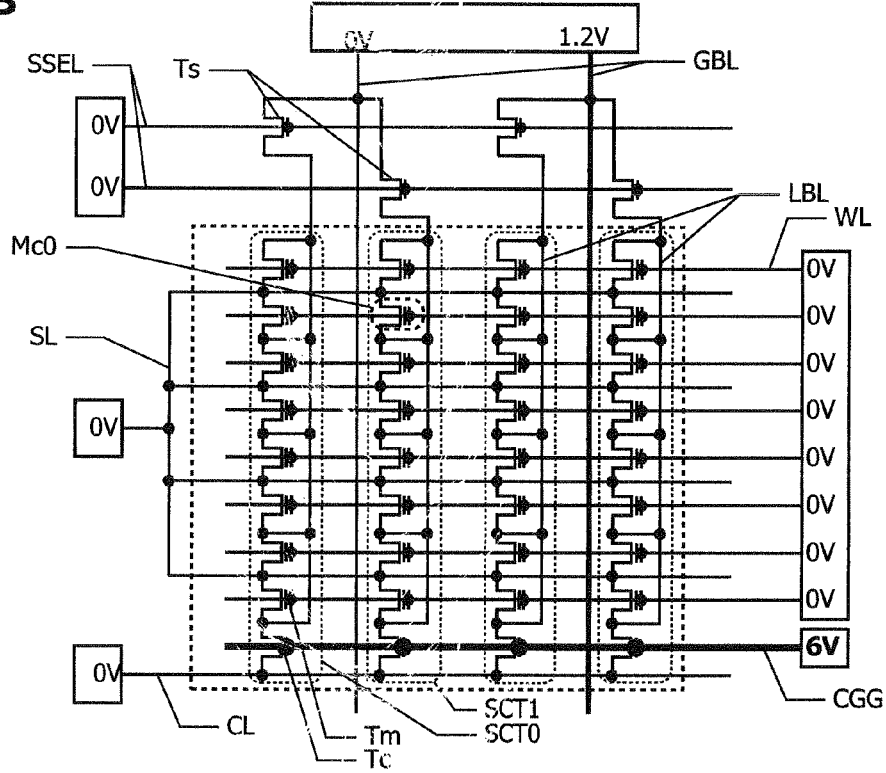

At time t2 defined in FIG. 2, a voltage, for instance 6 V, exceeding the threshold voltage is applied to the charging gate line CGG. As illustrated in FIG. 3B, the charging transistor Tc is turned on as 6 V is applied to the charging gate line CGG.

Figure 3C:
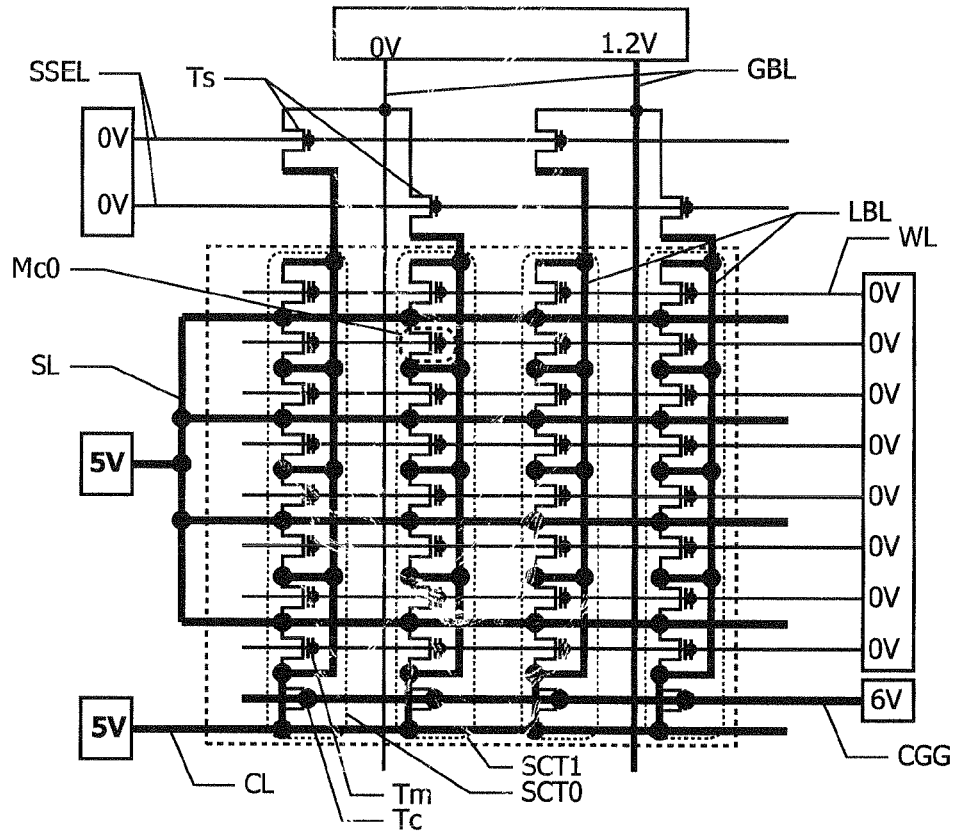

At time t3 defined in FIG. 2, a relatively high voltage, for instance 5 V, is applied to the source line SL and a precharge voltage, for instance 5 V, is simultaneously applied to the charging line CL. As illustrated in FIG. 3C, the precharge voltage (5 V) is applied to all local bit lines LBL through the charging transistors Tc. The local bit line LBL that is connected to the selected memory cell Mc0 is hereinafter referred to as the selected local bit line and the other local bit lines LBL are referred as the non-selected local bit lines. As illustrated in FIG. 2, the selected local bit line LBL and the non-selected local bit lines LBL are precharged at 5 V.

Figure 3D:
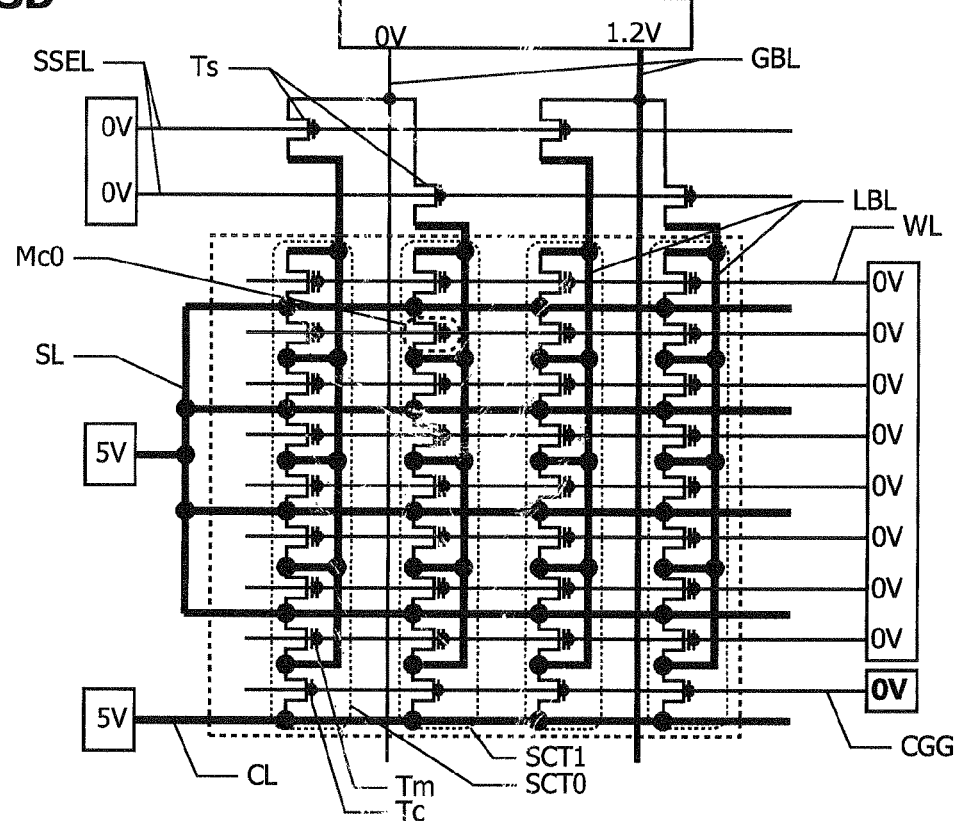

At time t4 defined in FIG. 2, the voltage applied to the charging gate line CGG is returned to 0 V. As illustrated in FIG. 3D, the charging transistors Tc are turned off. This brings the local bit lines LBL into floating state. With no flows of electric charges, the voltage applied to the local bit lines LBL is maintained at 5 V.

Figure 3E:
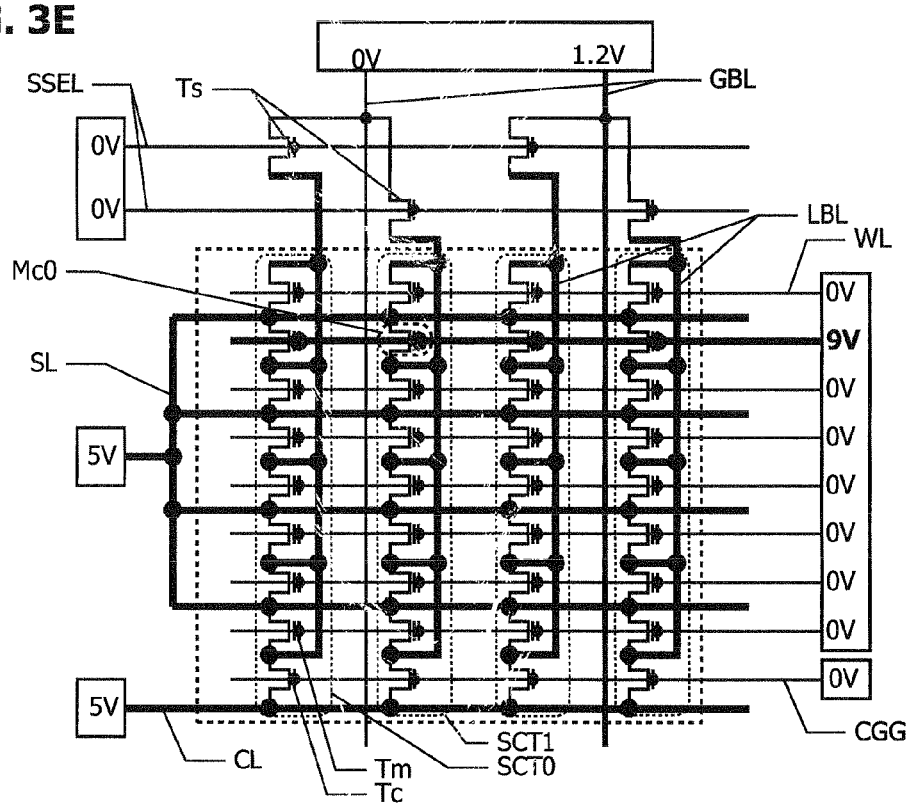

At time t5 defined in FIG. 2, 9 V is applied to the word line WL for the row containing the selected memory cell Mc0. The word line WL for the row containing the selected memory cell Mc0 is hereinafter referred to as the selected word line. The voltage applied to the other non-selected word lines WL is maintained at 0 V. As illustrated in FIG. 3E, 9 V is applied to the control gate of the memory transistor Tm in each memory cell boated in the same row as the selected memory cell Mc0.

Figure 3F:
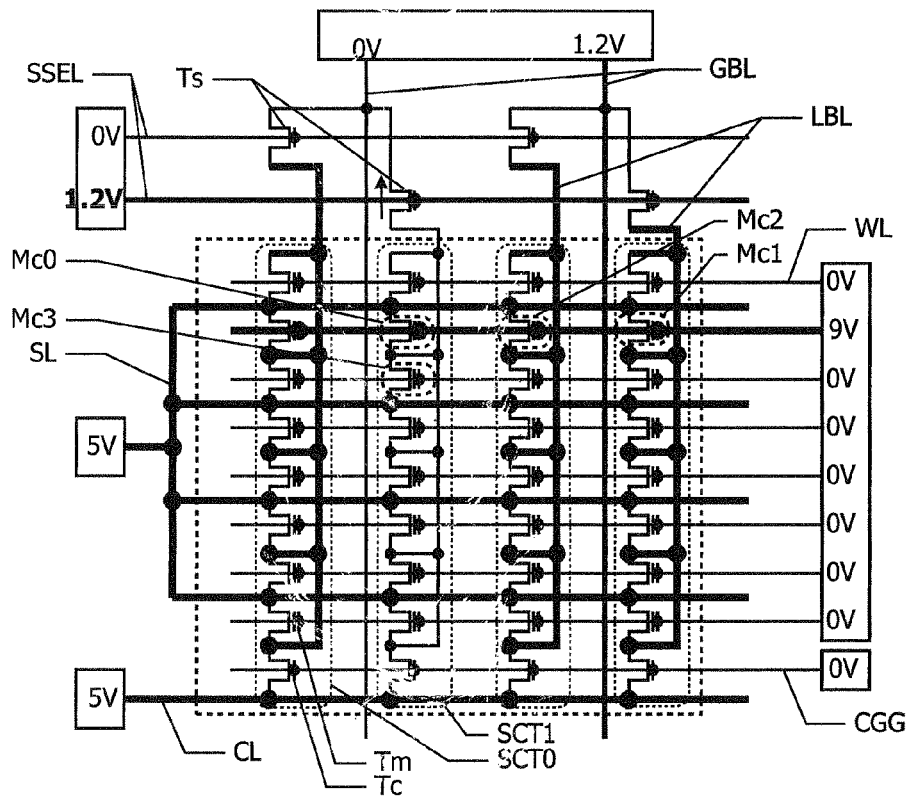

At time t6 defined in FIG. 2, 1.2 V is applied to the sector select line SSEL corresponding to the sector 1, which contains the selected memory cell Mc0. The sector select line SSEL corresponding to the sector that contains the selected memory cell Mc0 is hereinafter referred to as the selected sector select line. The voltage applied to the sector select line SSEL corresponding to the other sector, i.e. the sector 0, is maintained at 0 V. The sector select line SSEL corresponding to the sector that does not contain the selected memory cell Mc0 is hereinafter referred to as the non-selected sector select line. As illustrated in FIG. 3F, the sector select transistor Ts corresponding to the selected local bit line LBL, which is connected to the selected memory cell Mc0 is turned on. This discharges the selected local bit line LBL through the sector select transistor Ts and the voltage applied to it is decreased to 0 V.

A voltage of 1.2 V is applied through a global bit line GBL to the source of the other sector select transistor Ts corresponding to the sector 1. Accordingly, this sector select transistor Ts is not turned on. Consequently, the voltage applied to the non-selected local bit line LBL, which corresponds to the sector 1 and is not connected to the selected cell, is maintained at a voltage of 5 V. Further, since the sector select transistor Ts corresponding to the sector 0 has a gate voltage of 0 V, the sector select transistor Ts corresponding to the sector 0 is in the turned off state. Accordingly, the voltage applied to the non-selected local bit line LBL for the sector 0 is also maintained at 5 V.

Figure 4A:
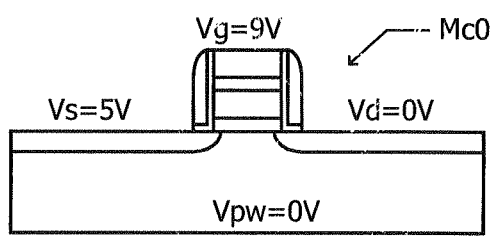
FIG. 4A-4D are cross sections illustrating the voltage application state of a memory transistor during a write process of the non-volatile semiconductor memory according to Embodiment 1.

As illustrated in FIG. 4A, the memory transistor Tm in the selected memory cell Mc0 now has a source voltage Vs of 5 V, drain voltage Vd of 0 V, gate voltage Vg of 9 V, and p-type well voltage Vpw of 0 V. The electrons accelerated from the drain to the source are injected into the floating gate to write data.

Figure 4B:
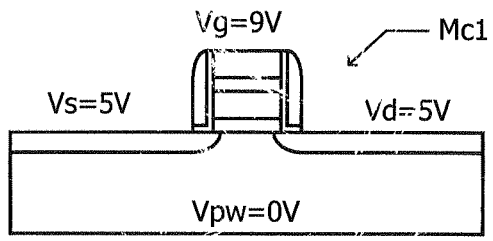
Figure 4C:
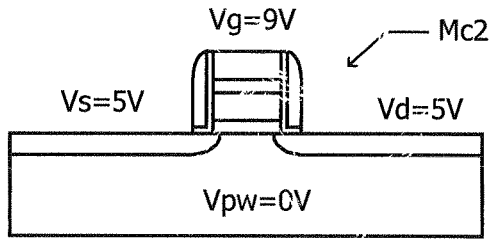

FIG. 4B illustrates the voltage application state in the memory transistor Tm in a non-selected memory cell Mc1 that belongs to the same row and the same sector 1 as the selected memory cell Mc0 but to the other global bit line GBL than that connected to the selected memory cell Mc0. FIG. 4C illustrates the voltage application state in the memory transistor Tm in a non-selected memory cell Mc2 that belongs to the same row as the selected memory cell Mc0 but to the sector 0, which is different from the sector that contains the selected memory cell Mc0.

In FIGS. 4B and 4C, the memory transistor now has a source voltage Vs and drain voltage Vd of 5 V, gate voltage Vg of 9 V, and p-type well voltage Vpw of 0 V. There are no electric currents flowing because the source and the drain have the same electric potential. Accordingly, no data are written.

Figure 4D:
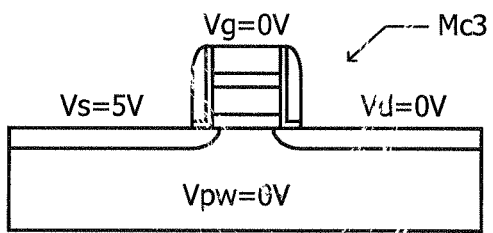

FIG. 4D illustrates the voltage application state in the memory transistor Tm in a non-selected memory cell Mc3 that is connected to the same local bit line LBL as the selected memory cell Mc0. The memory transistor now has source voltage Vs of 5 V, drain voltage Vd of 0 V, gate voltage Vg of 0 V, and p-type well voltage Vpw of 0 V. There are no electric currents flowing because the gate voltage Vg is 0 V, and no data are written.

Here, the order of the application of 9 V to the selected word line WL at time t5 and that of 1.2 V to the selected sector select line SSEL at time t6 may be reversed. Specifically, 1.2 V may be applied to the selected sector select line SSEL at time t5 and 9 V may be applied to the selected word line WL at time t6.

At time t7 in FIG. 2, the voltage applied to the selected sector select line SSEL is returned to 0 V. In FIG. 3F, the sector select transistor Ts connected to the selected local bit line LBL is turned off. This brings the selected local bit line LBL into floating state. With no flows of electric charges, the voltage applied to the selected local bit line LBL is maintained at 0 V.

Figure 3G:
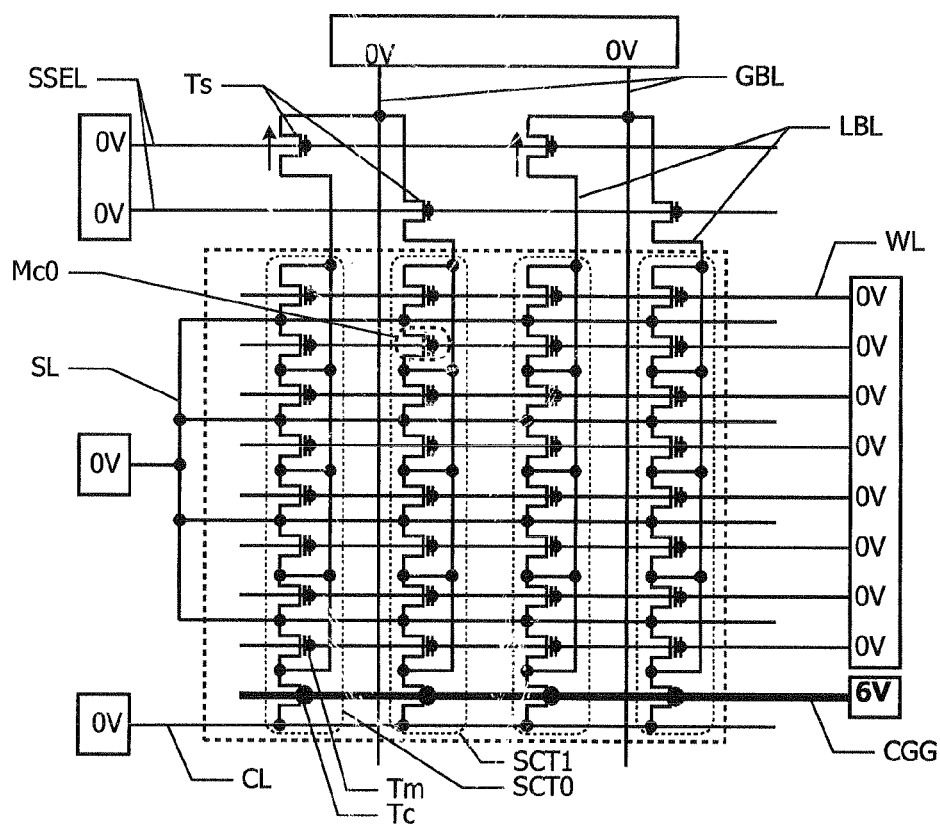

At time t8 in FIG. 2, the voltage applied to the selected word line WL is returned to 0 V. At time t9, the voltage applied to the source line SL and the charging line CL is returned to 0 V. Further, the data signal voltage applied to the global bit lines GBL is returned to 0 V. Consequently, the voltage applied to the non-selected global bit line GBL is returned to 0 V. Then, 6 V is applied to the charging gate line CGG. As illustrated in FIG. 3G, the charging transistors Tc are turned on. Consequently, the local bit lines LBL are discharged, and the voltage applied to them is returned to 0 V.

At time t10 in FIG. 2, the voltage applied to the non-selected sector select line SSEL is returned to 0 V. This brings the non-selected local bit lines LBL into floating state. With no flows of electric charges, the voltage applied to the non-selected local bit lines LBL is maintained at 0 V.

Described next is the data erase process. The local bit lines LBL and the source lines SL illustrated in FIG. 1 are brought into floating state. A voltage of 9 V is applied to the p-type well and −9 V is applied to the word lines WL. This difference in voltage works to extract the electrons stored in the floating gates into the substrate through Fowler-Nordheim (FN) tunneling. Thus, data are erased.

The data read process is described below with reference to FIG. 5. At time t1, 0.9 V is applied to the global bit lines GBL, subsequently, at time t2, 1.2 V is applied to the selected sector select line SSEL. This turns on the selected sector select transistors Ts, and the selected local bit line LBL is precharged at 0.9 V.

At time t3, 5 V is applied to the selected word line WL. If the selected memory cell is in erased state, the memory transistor Tm in the selected memory cell is turned on. Consequently, the selected local bit line LBL is discharged, and the voltage applied to it decreases as indicated by a solid line. The voltage applied to the global bit line GBL connected to the selected local bit line LBL decreases similarly as indicated by a solid line. If the selected memory cell is in written state, the memory transistor Tm in the selected memory cell is maintained in a turned off state. As a result, the voltage applied to the selected local bit line LBL is maintained at nearly 0.9 V. Whether the selected memory cell is in written state or in erased state can be determined if a reference voltage Vref is set in the range from 0 V to 0.9 V.

Figure 6:
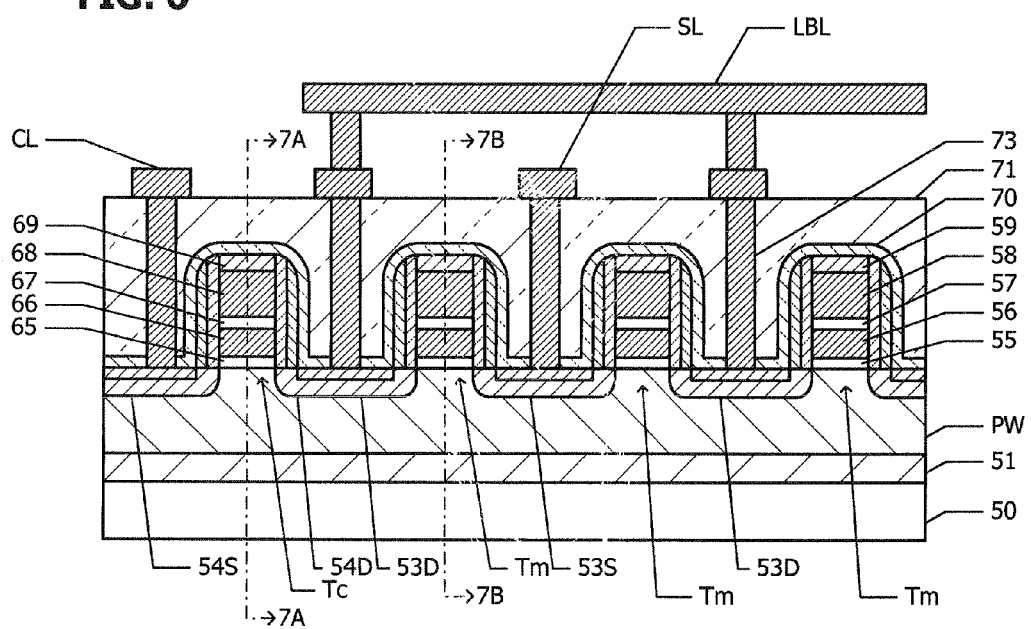
FIG. 6 is a cross section of the non-volatile semiconductor memory according to Embodiment 1.

FIG. 6 is a cross section of the memory transistors Tm and the charging transistor Tc of the non-volatile semiconductor memory according to Embodiment 1. The memory transistors Tm are arranged in matrix of rows and columns, as illustrated in FIG. 1. The cross section illustrated in FIG. 6 contains the memory transistors Tm aligned in the column direction and therefore connected to the same local bit line LBL.

An n-type well 51 is formed on the surface layer of a semiconductor substrate 50 made of, for instance, silicon, and a p-type well PW is formed in it. A plurality of memory transistors Tm are formed on the surface layer of the p-type well PW. The memory transistors Tm are arrayed in the horizontal direction in FIG. 6, and a charging transistor Tc is formed on the left side of the leftmost memory transistor Tm.

Stacked gate structure of a memory transistor Tm comprises a gate insulation film 55, floating gate 56, intermediate insulation film 57, and control gate 58. A metal silicide film 59 is formed on the top face of the control gate 58. An impurity diffused region is formed between mutually adjacent stacked gate structures and shared by two memory transistors Tm to work as a source 53S or a drain 53D. A metal silicide film 59 is also formed on the top faces of the source 53S and the drain 53D.

The stacked gate structure of a charging transistor Tc comprises a gate insulation film 65, gate electrode 66, intermediate insulation film 67, upper electrically conductive film 68, and metal silicide film 69. The gate insulation film 65, gate electrode 66, intermediate insulation film 67, upper electrically conductive film 68, and metal silicide film 69 are formed by the same film formation procedure as for the gate insulation film 55, floating gate 56, intermediate insulation film 57, control gate 58, and metal silicide film 59 of the memory transistors Tm. A side wall spacer is formed on the side face of each stacked gate structure.

The drain 54D of the charging transistor Tc and the drain 53D of the leftmost memory transistor Tm are formed of a single impurity diffused region.

For instance, the floating gate 56, control gate 58, gate electrode 66, and upper electrically conductive film 68 may be made of polysilicon. The gate insulation films 55 and 65 are made of silicon oxide. The intermediate insulation films 57 and 67 have a three-layered structure consisting of a silicon nitride film sandwiched between silicon oxide films. The metal silicide films 59 and 69 are made of cobalt silicide.

The memory transistors Tm and charging transistors Tc are covered by an etching stopper film 70. An interlayer or inter-level insulation film 71 is formed on the etching stopper film 70. The top face of the interlayer insulation film 71 is planarized. For instance, the interlayer insulation film 71 is made of silicon oxide, and the etching stopper film 70 is made of silicon nitride.

Source 53S of a memory transistor Tm is connected to a source line SL formed on the interlayer insulation film 71 through an electrically conductive plug 73. Source 54S of the charging transistor Tc is connected to a charging line CL formed on the interlayer insulation film 71 through another electrically conductive plug 73. Drain 53D of a memory transistor Tm is connected to a local bit line LBL in a wiring layer located above the source lines SL, through another electrically conductive plug 73.

Figure 7A:
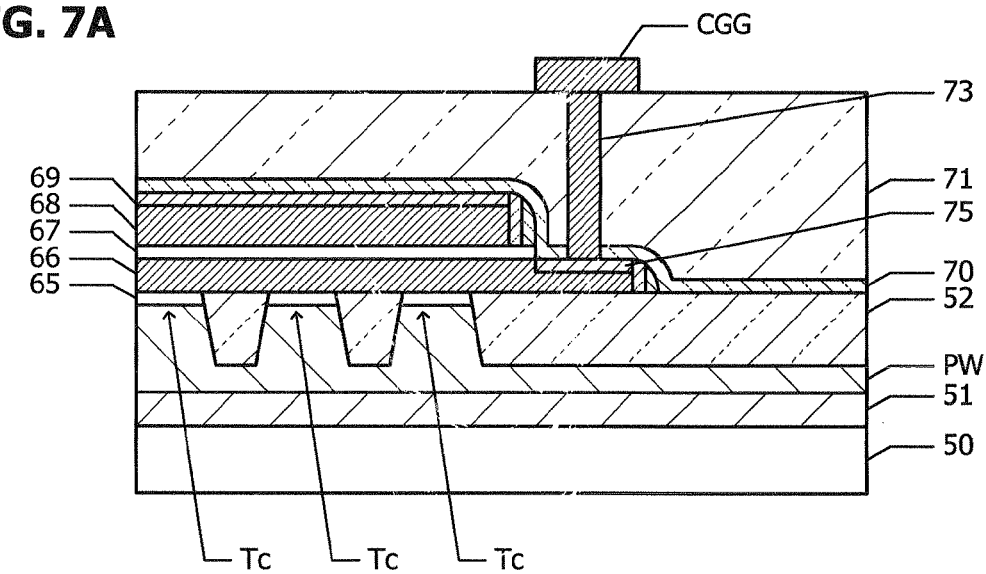
FIGS. 7A and 7B are cross sections along the dashed-dotted lines 7A-7A and 7B-7B, respectively, defined in FIG. 6.

FIG. 7A is a cross section of the charging transistors Tc. FIG. 7A illustrates a cross section along the row direction in FIG. 1 or a cross section along the dashed-dotted line 7A-7A in FIG. 6. Description on structural features which are already described in connection with the cross section in FIG. 6 are omitted in the following description.

A plurality of active regions are defined by the isolation film 52 formed on the surface layer of the semiconductor substrate 50. A charging transistor Tc is located in each active region. The gate electrode 66, intermediate insulation film 67, upper electrically conductive film 68, and metal silicide film 69 are shared by a plurality of charging transistors Tc aligned in the row direction. In the near-end region containing the end of the gate electrode 66, which extends in the row direction, the overlying intermediate insulation film 67, upper electrically conductive film 68, and metal silicide film E9 located are removed from above the former. A metal silicide film 75 is formed on the top face of the gate electrode 66, which is exposed after the removal of the intermediate insulation film 67.

The gate electrode 66 is connected to the charging gate line CGG formed on the interlayer insulation film 71, through the electrically conductive plug 73 located on the metal silicide film 75.

Figure 7B:
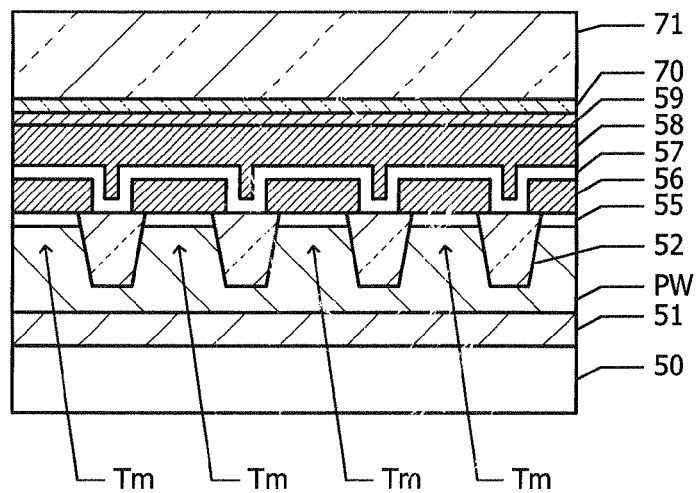

FIG. 7B is a cross section of memory transistors Tm. FIG. 7B illustrates a cross section along the row direction in FIG. 1 or a cross section along the dashed-dotted line 7A-7A in FIG. 6. Description on structural features which are described in connection with the cross section in FIG. 6 are omitted in the following description.

A plurality of active regions are defined by the isolation film 52 formed on the surface layer of the semiconductor substrate 50. A memory transistor Tm is located in each active region. A gate insulation film 55 and a floating gate 56 are formed for each memory transistor Tm in separated manner. An intermediate or interelectrode insulation film 57 and a control gate 58 are shared by the memory transistors Tm belonging to the same row.

In Embodiment 1, a voltage of 1.2 V is applied to the global bit lines GBL during the write process and a voltage of 0.9 V is applied to the global bit lines GBL during the read process. Free from application of a high voltage of up to about 5 V, decoders, sense amplifiers, and the like in the bit line control circuit 30 (FIG. 1) can be formed of low voltage transistors. Here, a low voltage transistor is defined as one that operates at a lower voltage as compared with the high-voltage transistors used in the word line control circuit 31. Low voltage transistors have a gate insulation film that is thinner than the gate insulation film of high-voltage transistors.

Bit line control circuit 30 can be constructed of low voltage transistors, allowing the bit line control circuit to occupy a reduced area on the chip. In addition, the use of low voltage transistors to construct sense amplifiers serves to shorten the time constants of the voltage decay in global bit lines GBL illustrated in FIG. 5. Thus, the read speed can be increased.

In Embodiment 1, the source lines SL and the charging line CL undergo the same voltage changes as illustrated in FIG. 2. Therefore, the charging lines CL may be connected to the source lines SL to eliminate the charging line control circuit 35.

The above embodiment, as well as the following embodiments, provides the following feature:

If the local bit lines are precharged at a precharge voltage, a voltage equivalent to the precharge voltage can be applied to the memory cells. Accordingly, it is unnecessary for a high voltage equivalent to the precharge voltage to be applied to the global bit lines. This allows the circuit for controlling the global bit lines to be constructed of low voltage transistors, serving to reduce the chip area and increase the read speed.

Embodiment 2

Figure 8:
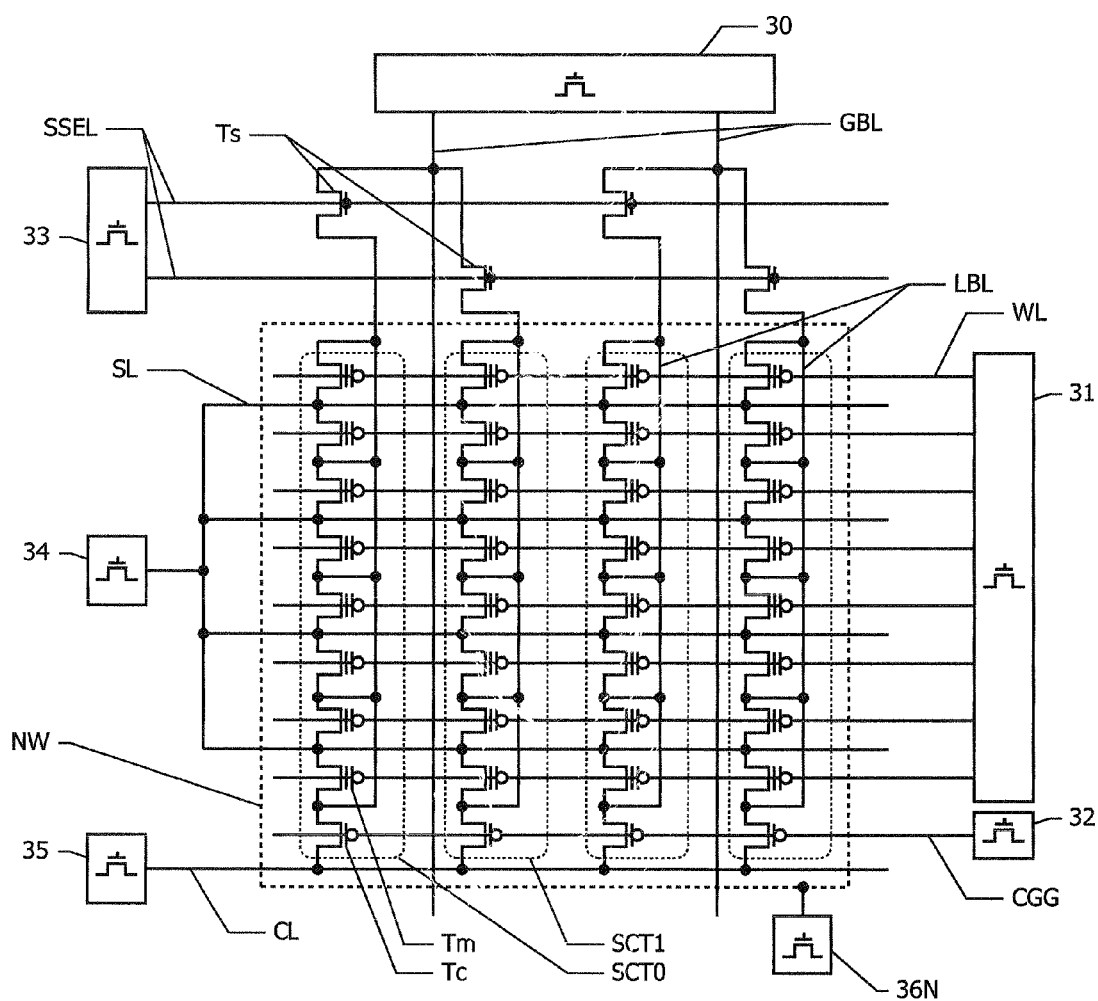
FIG. 8 is an equivalent circuit diagram of the non-volatile semiconductor memory according to Embodiment 2.

FIG. 8 is an equivalent circuit diagram of the non-volatile semiconductor memory according to Embodiment 2. N-channel floating gate type transistors are used for the memory transistors Tm in Embodiment 1 as illustrated in FIG. 1. In Embodiment 2, p-channel floating gate type transistors are used instead. Also, p-channel MOS transistors are used for the charging transistors Tc. The memory cell transistors Tm and the charging transistors Tc are located in the same n-type well NW. The n-type well voltage control circuit 36N applies a well voltage to the n-type well NW. Regarding other structures, they are similar to those of Embodiment 1 illustrated in FIG. 1.

The working mechanism of the non-volatile semiconductor memory according to Embodiment 2 is described below with reference to FIG. 9, FIG. 10A to 10F, and FIG. 11A to 11D.

FIG. 9 is a timing chart illustrating the write process. In the standby state, 0 V is applied to the word lines WL, charging gate line CGG, global bit lines GBL, sector select lines SSEL source lines SL, charging line CL, and n-type well NW. The local bit lines LBL are in floating state. In FIG. 9, the durations of the floating state are illustrated by broken lines.

Figure 10A:
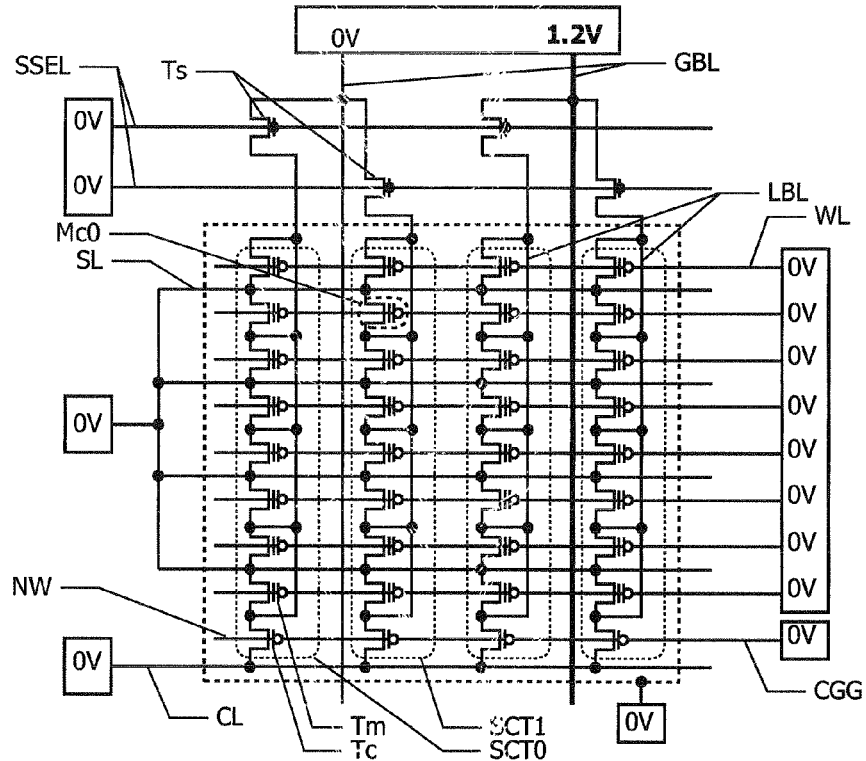
FIG. 10A-10F are equivalent circuit diagrams illustrating the voltage application state during write operation of the non-volatile semiconductor memory according to Embodiment 2.

At time t1, data signal is applied to the global bit lines GBL. The global bit line GBL for which 0 V is maintained is referred to as the selected global bit line, and the global bit line GBL to which 1.2 V is applied is referred to as the non-selected global bit line. In FIG. 10A, the left global bit line GBL is maintained at 0 V, and 1.2 V is applied to the right global bit line GBL. Described below is a case where datum is written in the memory cell Mc0 on the second row in the sector 1, which is connected to the left global bit line GBL.

Figure 10B:
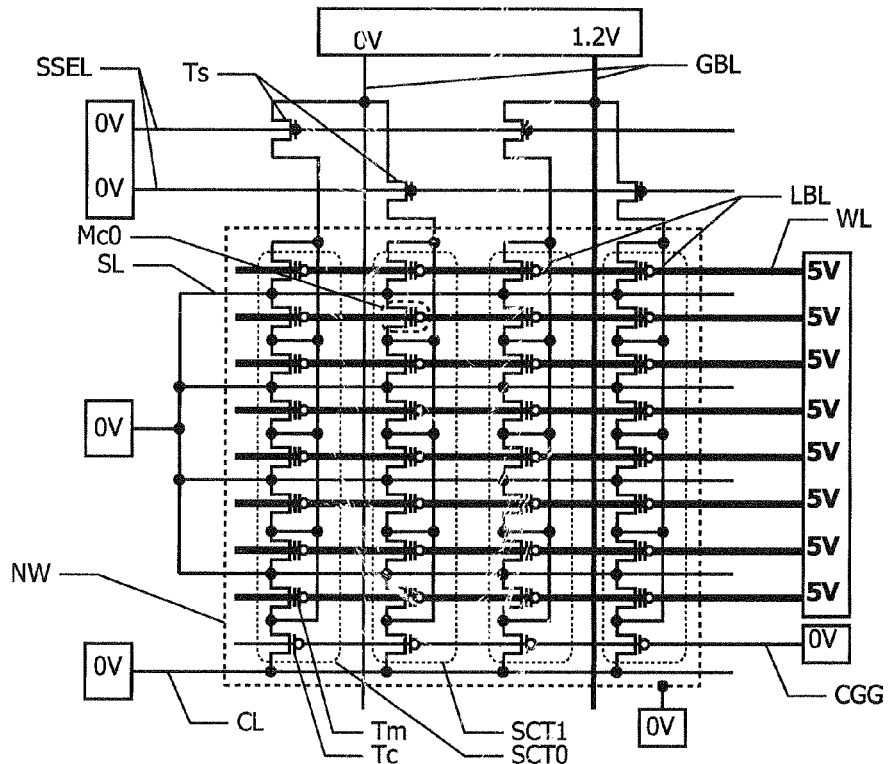

At time t2 defined in FIG. 9, 5 V is applied to all word lines WL. FIG. 10B illustrates a state where 5 V is applied to the word lines WL.

Figure 10C:
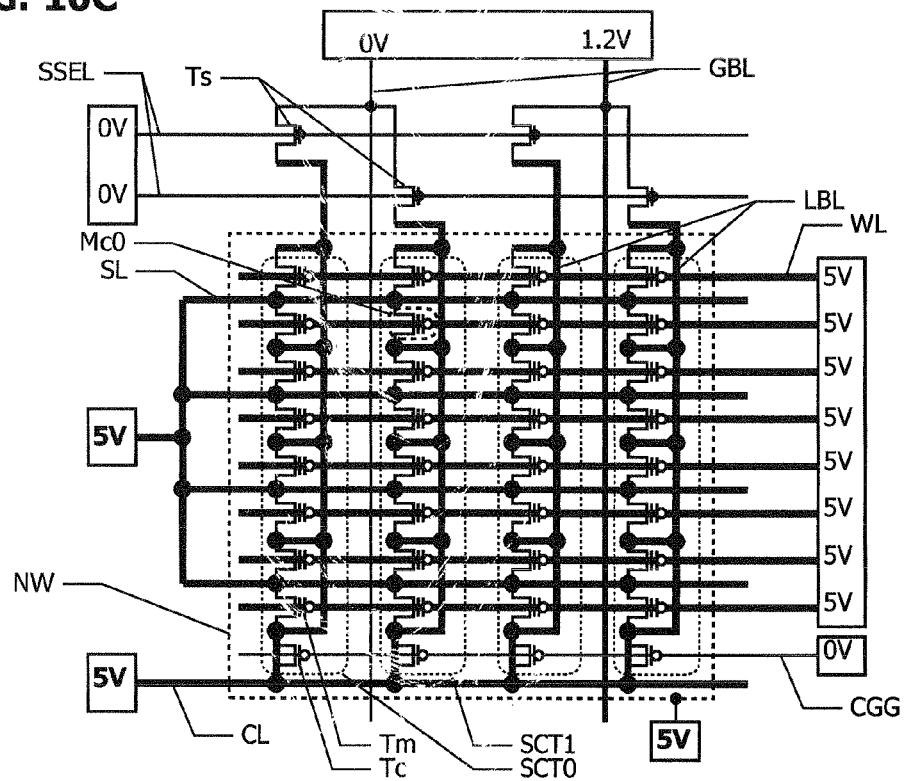

At time t3 in FIG. 9, 5 V, is applied to the source line SL, charging line CL, and n-type well NM. As illustrated in FIG. 10C, the charging transistors Tc are turned on, and the local bit lines LBL are precharged at a precharge voltage of 5 V.

Figure 10D:
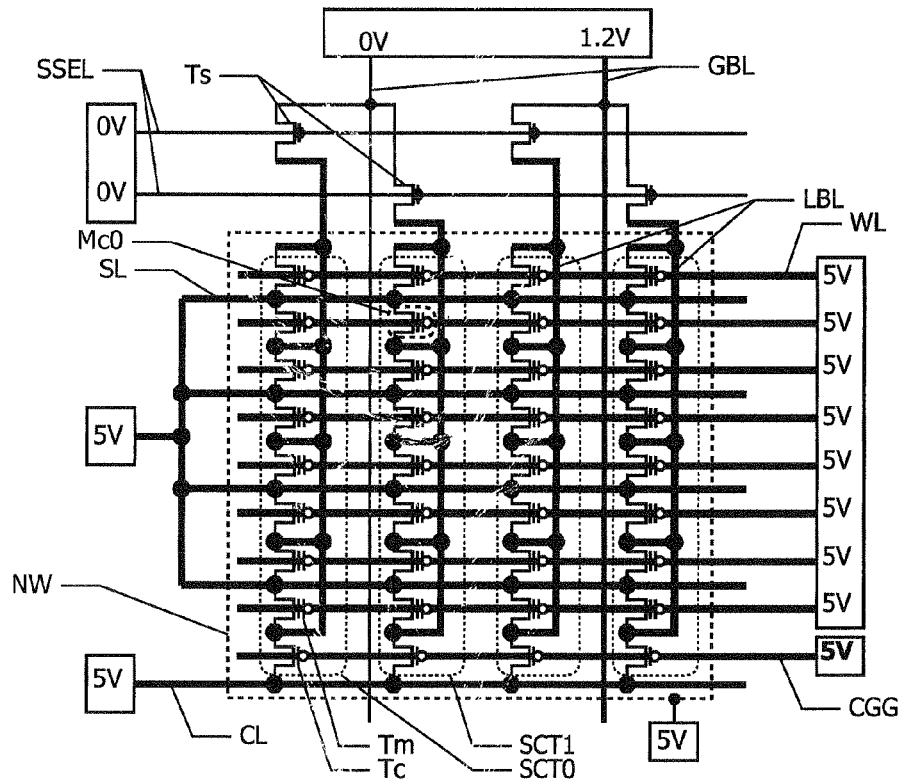
Figure 10E:
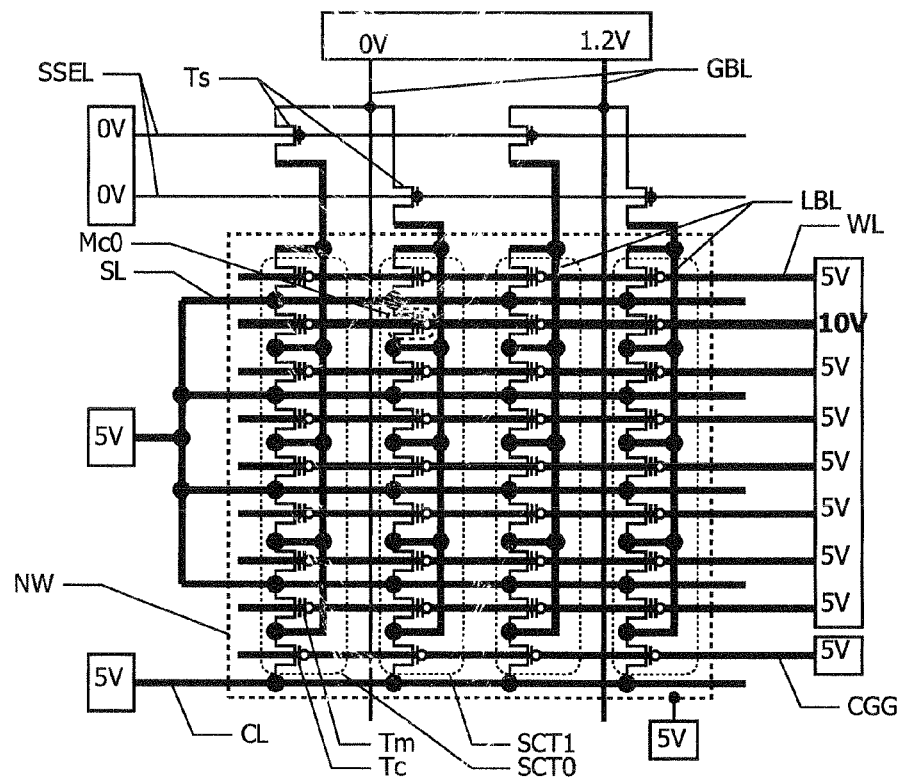

At time t4 defined in FIG. 9, 6 V is applied to the charging gate line CGG. As illustrated in FIG. 10D, the charging transistors Tc are turned off. This brings the local bit lines LBL into floating state. The voltage applied to the local bit lines LBL is maintained at 5 V.

At time t5 defined in FIG. 9, 10 V is applied to the word line (selected word line) WL connected to the selected memory cell Mc0. As illustrated in FIG. 10E, 10 V is applied to the word line WL on the second row. Application of 5 V is maintained for other (non-selected) word lines WL.

Figure 10F:
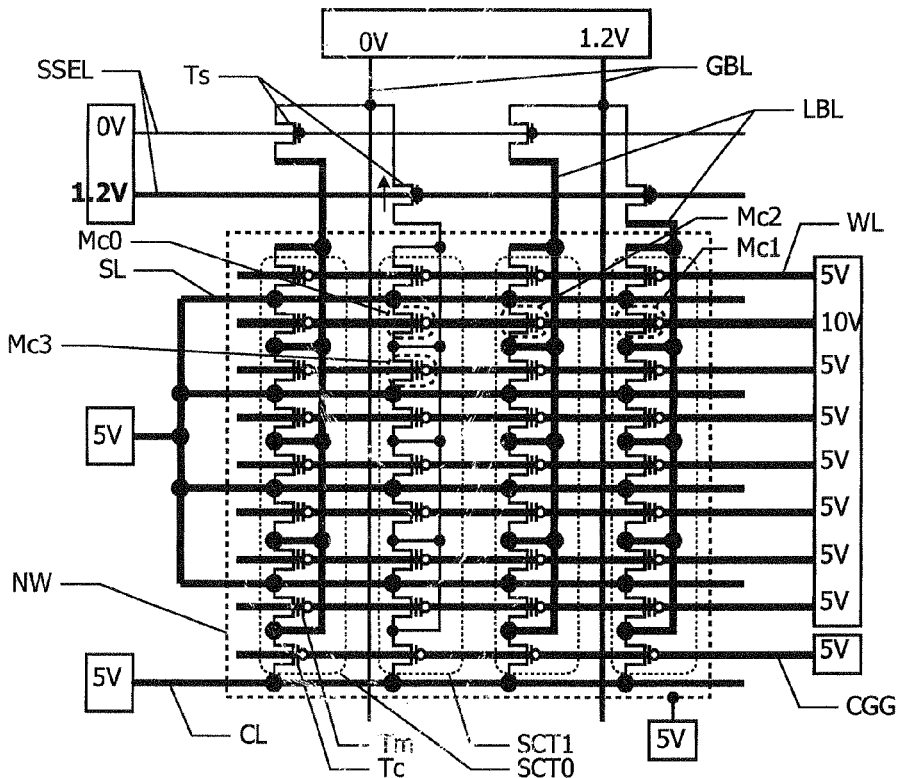

At time t6 defined in FIG. 9, 1.2 V is applied to the sector select line SSEL for the sector 1, which contains the selected memory cell Mc0. This sector select line SSEL is hereinafter referred to as the selected sector select line. As illustrated in FIG. 10F, the local bit line (selected local bit line) LBL connected to the selected memory cell Mc0 is discharged through the sector select transistor Ts. Accordingly, the voltage applied to the selected local bit line LBL is reduced to 0 V. Other (non-selected) local bit lines LBL are still in floating state and maintained at 5V.

Figure 11A:
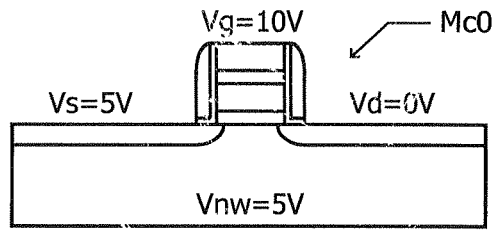
FIG. 11A-11D are cross sections illustrating the voltage application state of a memory transistor during write operation of the non-volatile semiconductor memory according to Embodiment 2.

FIG. 11A illustrates the voltage application state in the memory transistor Tm in the selected memory cell Mc0. The n-type well voltage Vnw and the source voltage Vs is set at 5 V, the drain voltage Vd is set at 0 V, and the gate voltage Vg is set at 10 V. Electrons generated at the interface between the drain and the n-type well by inter-band tunneling are injected into the floating gate. Thus, datum is written in the selected memory cell Mc0.

Figure 11B:
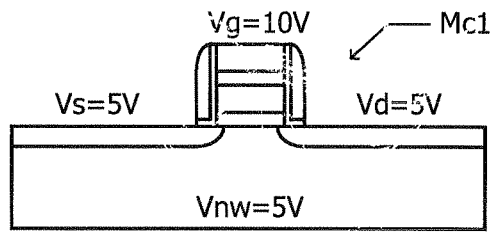
Figure 11C:
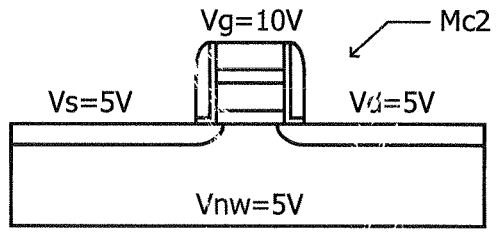

FIG. 11B illustrates the voltage application state in the memory transistor Tm in a non-selected memory cell Mc1 that belongs to the same row and the same sector 1 as the selected memory cell Mc0 but to a different global bit line GBL than that connected to the selected memory cell Mc0. FIG. 11C illustrates the voltage application state in the memory transistor Tm in a non-selected memory cell Mc2 that belongs to the same row as the selected memory cell Mc0 but to a different sector (sector 0) from that containing the selected memory cell Mc0. It has a source voltage Vs and drain voltage Vd of 5 V, gate voltage Vg of 10 V, and n-type well voltage Vnw of 5 V. The drain is in floating state but is precharged at 5 V, and no difference in voltage occurs between the drain and the n-type well. The difference in voltage between the source and the drain is also nearly 0. Inter-band tunneling does not take place, and data are not written.

Figure 11D:
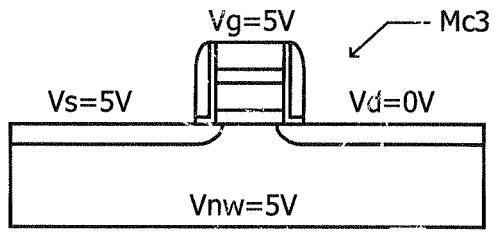

FIG. 11D illustrates the voltage application state in the memory transistor Tm in a non-selected memory cell Mc3 that is connected to the same local bit line LBL as the selected memory cell Mc0. It has a source voltage Vs of 5 V, drain voltage Vd of 0 V, gate voltage Vg of 5 V, and n-type well voltage Vnw of 5 V. With no difference between the gate voltage Vg and the n-type well voltage Vnw, electrons generated by inter-band tunneling are not injected into the floating gate. Therefore, no data are written.

At time t7 defined in FIG. 9, the voltage applied to the selected word line WL is returned to 5 V. At time t8, the voltage applied to the selected sector select line SSEL is returned to 0 V. Thus, the sector select transistor Ts is turned off, bringing the selected local bit line LBL illustrated in FIG. 10F into floating state. Here, the voltage applied to the selected local bit line LBL is maintained at 0 V.

At time t9 defined in FIG. 9, the voltages applied to all word lines WL, charging gate line CGG, source line SL, charging line CL, and n-type well NW are returned to 0 V. An electric current flows tri the normal direction from the drain toward the n-type well NW in the memory transistor Tm connected to the local bit line LBL, bringing the voltage applied to the non-selected local bit line LBL back to 0V.

At time t10 defined in FIG. 9, the data signal voltage applied to the global bit lines GBL is returned to 0 V.

Described next is the erase process. The global bit lines GBL illustrated in FIG. 8 are brought into floating state, and 9 V is applied to the source line SL and the n-type well NW while −9 V is applied to the word lines WL. The difference in voltage applied to the word lines WL and the n-type well NW works to extract the electrons stored in the floating gate into the substrate. Thus, data are erased.

Described next is the read process. A voltage of 1.2 V is applied to the source line SL and the n-type well NW. A voltage of −4 V is applied to the selected word line WL, and 1.2 V is applied to the non-selected word lines WL. A voltage of 0 V is applied to the global bit lines GBL. An electric current flows in the memory transistor Tm when the selected memory cell is in written state, and no electric current flows in the memory transistor Tm when it is in erased state. Whether the selected memory cell is in written state or in erased state can be determined from the flow of this electric current detected by the sense amplifier in the bit line control circuit 30.

Figure 12:
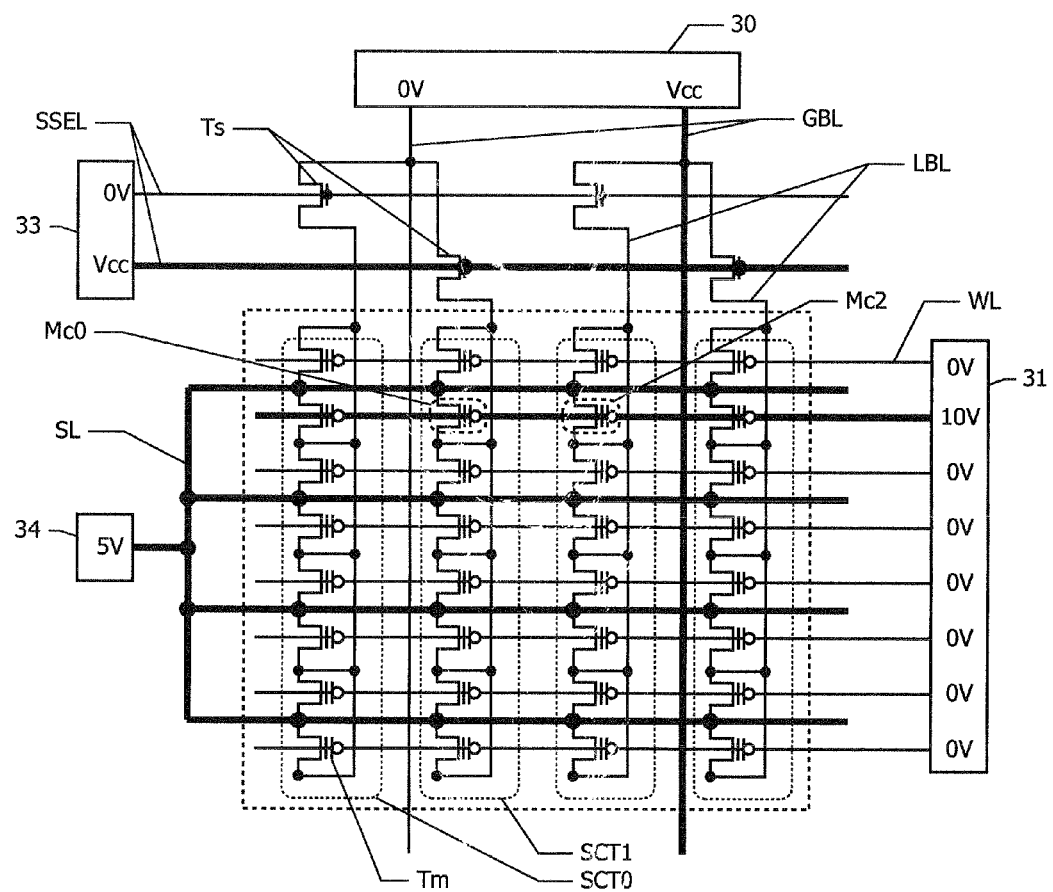
FIG. 12 is an equivalent circuit diagram of the non-volatile semiconductor memory according to a comparative example of Embodiment 2.

FIG. 12 is an equivalent circuit diagram of the non-volatile semiconductor memory according to the comparative example. In the comparative example, the memory transistor Tm is also formed of a p-channel floating gate type transistor. The comparative example, however, does not has charging transistors Tc. Description will be made on operation for writing data in the memory transistor Tm in the selected memory cell Mc0.

A voltage of 0 V is applied to the selected global bit line GBL connected to the selected memory cell Mc0, and a voltage Vcc is applied to the other (non-selected) global bit line GBL. A voltage Vcc is applied to the sector select line SSEL corresponding to the sector that contains the selected memory cell Mc0, and 0 V is applied to the non-selected sector select line SSEL. The source line SL is set to 5 V. A voltage of 10 V is applied to the word line WL for the row containing the selected memory cell Mc0.

Figure 13A:
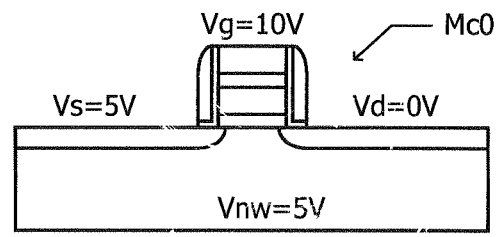
FIGS. 13A and 13B are cross sections illustrating the voltage application state of a memory transistor during write operation of the non-volatile semiconductor memory according to the comparative example.

FIG. 13A illustrates the voltage application state in the memory transistor Tm in the selected memory cell Mc0. A source voltage Vs is 5 V, drain voltage Vd is 0 V, n-type well voltage Vnw is 5 V, and gate voltage Vg is 10 V. Data are written as in the case of Embodiment 2 illustrated in FIG. 11A.

Figure 13B:
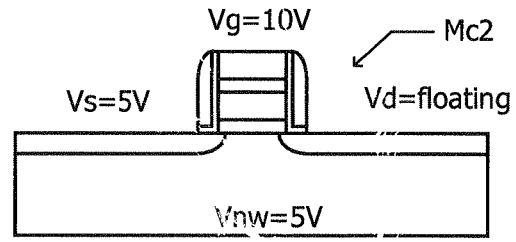

FIG. 13B illustrates the voltage application state in the memory transistor Tm in a non-selected memory cell Mc2 that belongs to the same row as the selected memory cell Mc0 but to a different sector (sector 0) from that containing the selected memory cell Mc0. The local bit line LBL connected to the drain is in floating state, bringing the drain into floating state. If the electric potential in the drain reaches 1 V as a result of capacitive coupling of the drain with other regions, the difference in electric potential between the n-type well and the drain can reach 4 V to cause unexpected writing (program disturbance).

In Embodiment 2, the drain of the memory transistor Tm in the non-selected memory cell Mc2 is precharged at 5 V as illustrated in FIG. 11C to prevent program disturbance.

In Embodiment 2 as well, the voltage applied to the global bit lines GBL is only up to 1.2 V. Therefore, the bit line control circuit 30 may be constituted of low voltage transistors as in Embodiment 1.

In Embodiment 2, the source line SL and the charging line CL undergo the same voltage changes. Accordingly, the charging line CL may be connected to the source line SL to eliminate the charging line control circuit 35. Here, as illustrated in Embodiment 2, the source line control circuit 34 and the charging line control circuit 35 may be provided independently to allow the voltages applied to the source line SL and the charging line CL to be controlled independently. For instance, the voltage applied to the source line SL and that applied to the charging line CL may differ depending on the gate length and punch-through pressure resistance of the memory transistor Tm.

This serves to prevent program disturbance.

Embodiment 3

Figure 14:
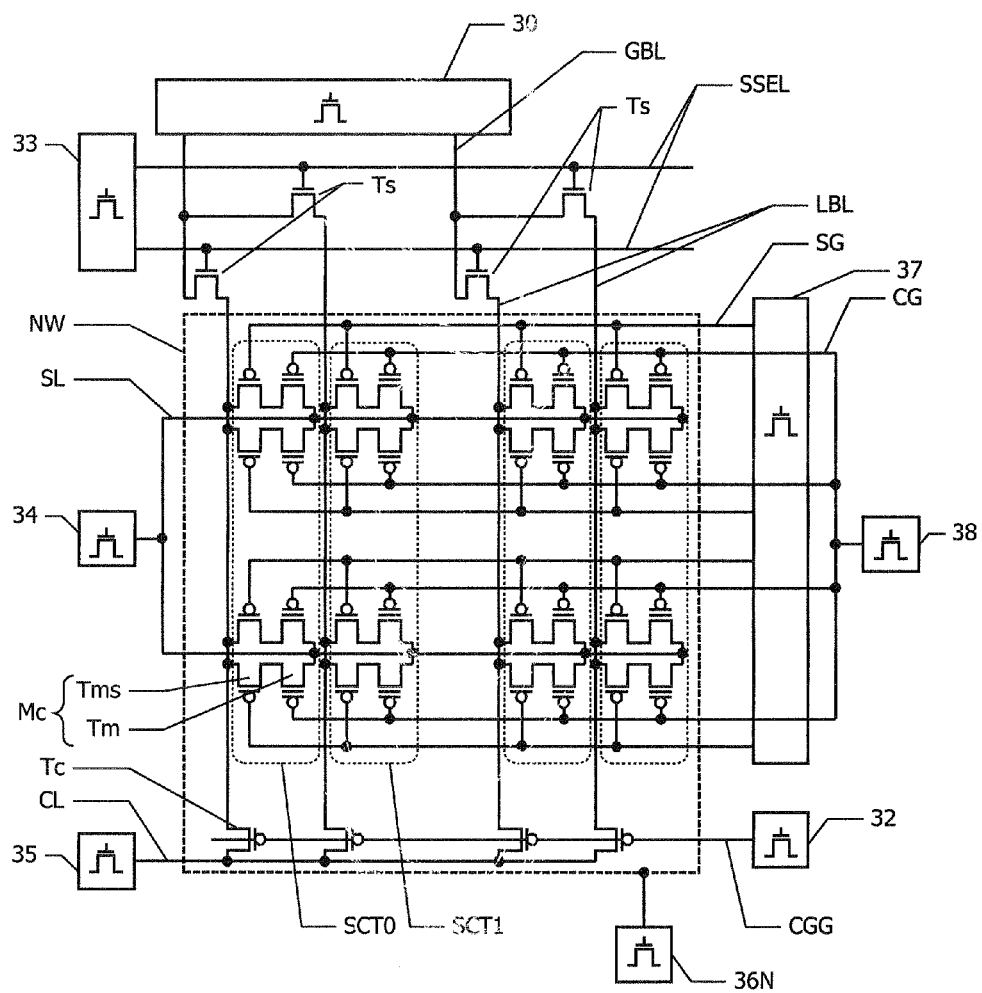
FIG. 14 is an equivalent circuit diagram of the non-volatile semiconductor memory according to Embodiment 3.

FIG. 14 is an equivalent circuit diagram of the non-volatile semiconductor memory according to Embodiment 3. The configuration of the global bit lines GBL, local bit lines LBL, and sector select transistors Ts is the same as that according to Embodiment 1 illustrated in FIG. 1. Multiple memory cells Mc are arranged in matrix.

Each of the memory cells Mc contains a select transistor Tms and a memory transistor Tm. Each select transistor Tms is a p-channel MOS transistor and each memory transistor Tm is a p-channel floating gate type transistor. Source of the select transistor Tms and drain of the memory transistor Tm are connected to each other.

Gates of the select transistors Tms in the memory cells Mc in a row are connected to a same select gate line (row select line) SG extending in the row direction, while control gates of the memory transistors Tm in the memory cells Mc in a row are connected to a same control gate line CG extending in the row direction. Drains of the select transistors Tms in the memory cells Mc in a column are connected to a same local bit line LBL extending in the column direction. Sources of the memory transistors Tm are connected to the source line SL.

The local bit lines LBL are connected through the respective charging transistors Tc to the same charging line CL. Each charging transistor Tc is formed of a p-channel MOS transistor. Gates of the charging transistors Tc are connected to a same charging gate line CGG. The select transistors Tms, memory transistors Tm, and charging transistors Tc are arranged in the same n-type well NW.

The bit line control circuit 30 applies data signal to the global bit lines GBL. The sector control circuit 33 applies data signal to the sector select lines SSEL. The source line control circuit 34 applies a source voltage to the source line SL. The charging line control circuit 35 applies a precharge voltage to the charging line CL. The charging gate control circuit 32 applies charging control signal to the charging gate line CGG. The select gate line control circuit (row select circuit) 37 applies select signal to the select gate lines SG. The control gate line control circuit 38 applies control gate signals to the control gate lines CG. Here, the charging line CL may be connected directly to the source line SL to eliminate the charging line control circuit 35.

The working mechanism of the non-volatile semiconductor memory according to Embodiment 3 is described below with reference to FIG. 15, FIG. 16A to 16G, and FIG. 17A to 17D.

Figure 15:
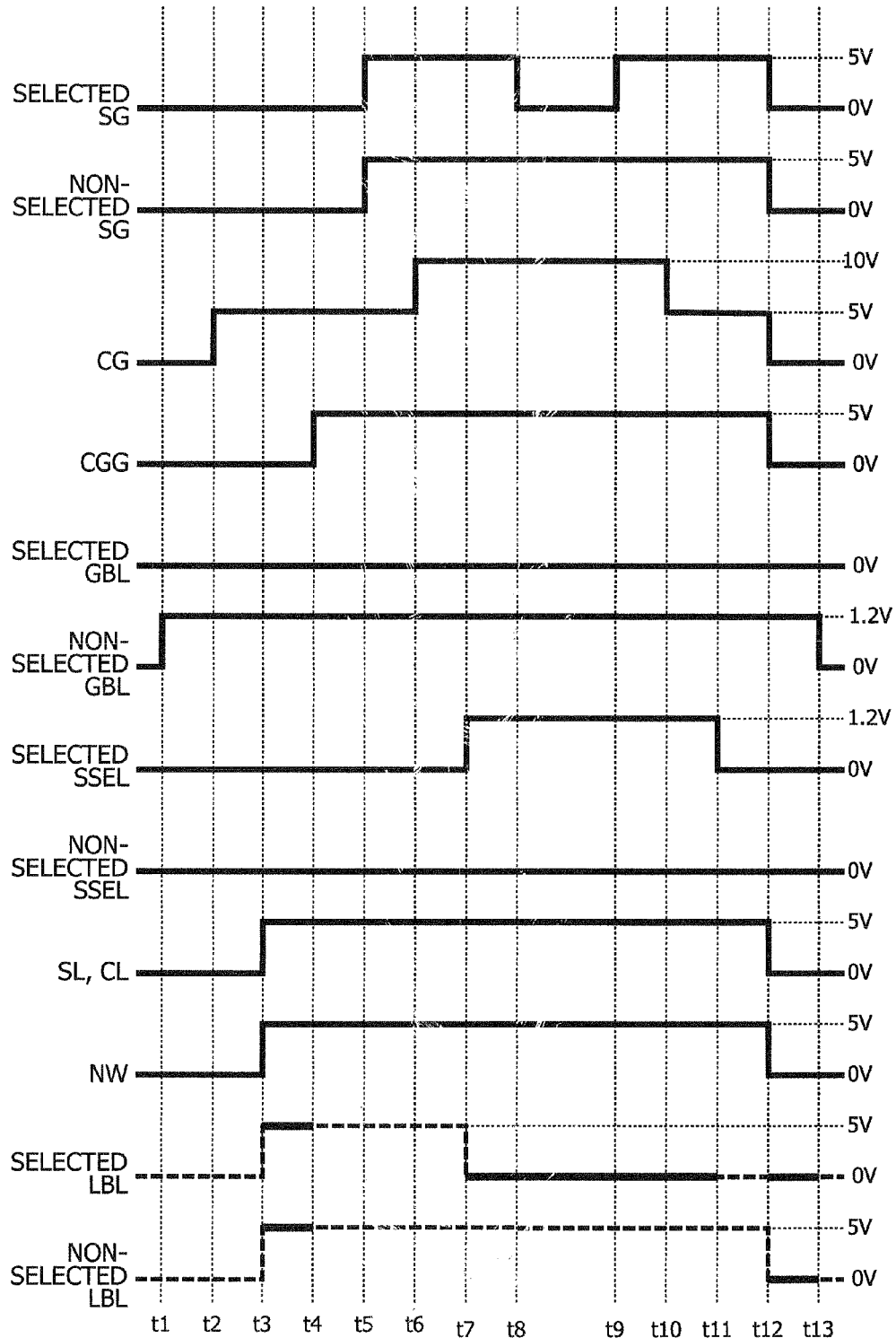
FIG. 15 is a timing chart for write operation of the non-volatile semiconductor memory according to Embodiment 3.

FIG. 15 illustrates a timing chart for write operation. In the standby state, 0 V is applied to the select gate lines SG, control gate lines CG, charging gate line CGG, global bit lines GBL, sector select lines SSEL, source line SL, charging line CL, and n-type well NW.

Figure 16A:
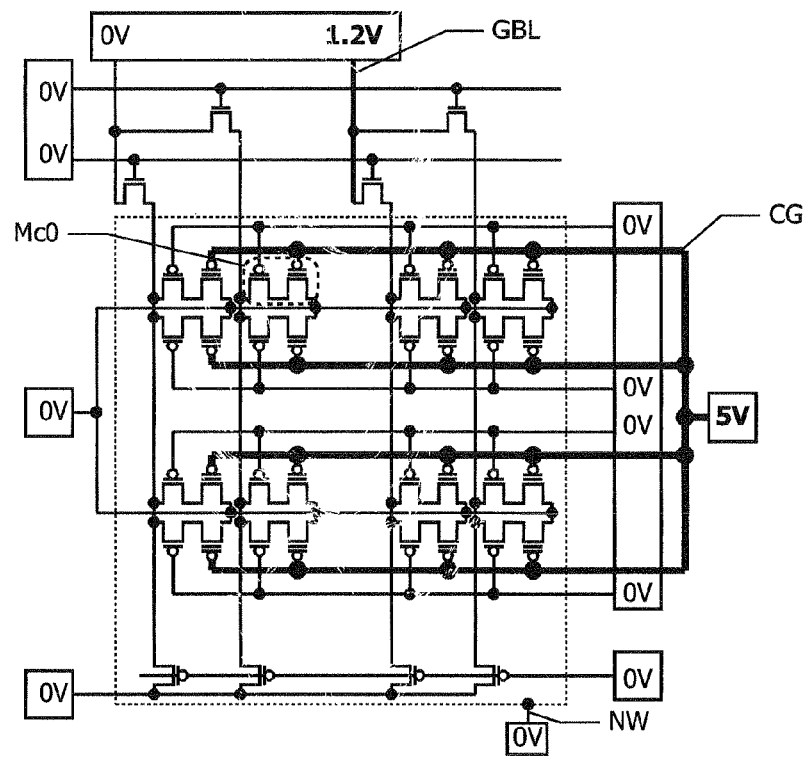
FIG. 16A-16G are equivalent circuit diagrams illustrating the voltage application state during write operation of the non-volatile semiconductor memory according to Embodiment 3.

At time t1, data signal is applied to the global bit lines GBL. Referring to FIG. 16A, description will continue for case where 0 V is applied to the left global bit line GBL while 1.2 V is applied to the right global bit line GBL. The global bit line GBL to which 0 V is applied is hereinafter referred to as the selected global bit line while the global bit line GBL to which 1.2 V is applied is hereinafter referred to as the non-selected global bit line.

Figure 5:
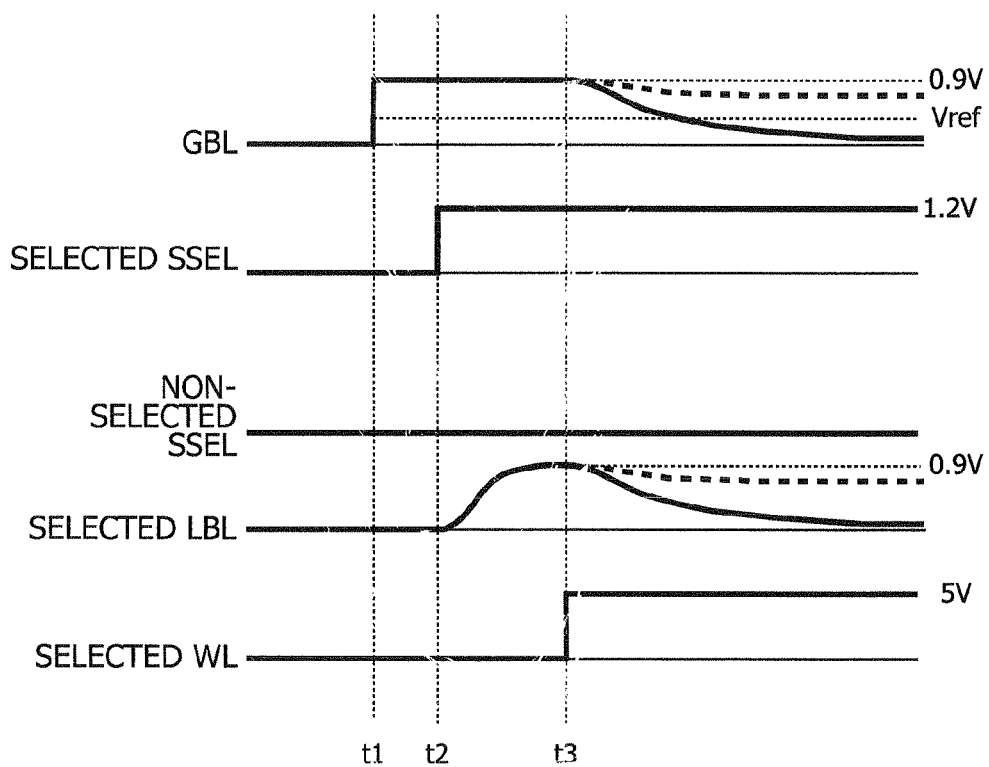
FIG. 5 is a timing chart for read operation of the non-volatile semiconductor memory according to Embodiment 1.

At time t2 in FIG. 15, 5 V is applied to the control gate lines CG. In FIG. 16A, 5 V is applied to the control gate lines CG. Description will be made on a case where data is written in the memory cell (selected memory cell) Mc0 that belongs to the second column of the first row.

Figure 16B:
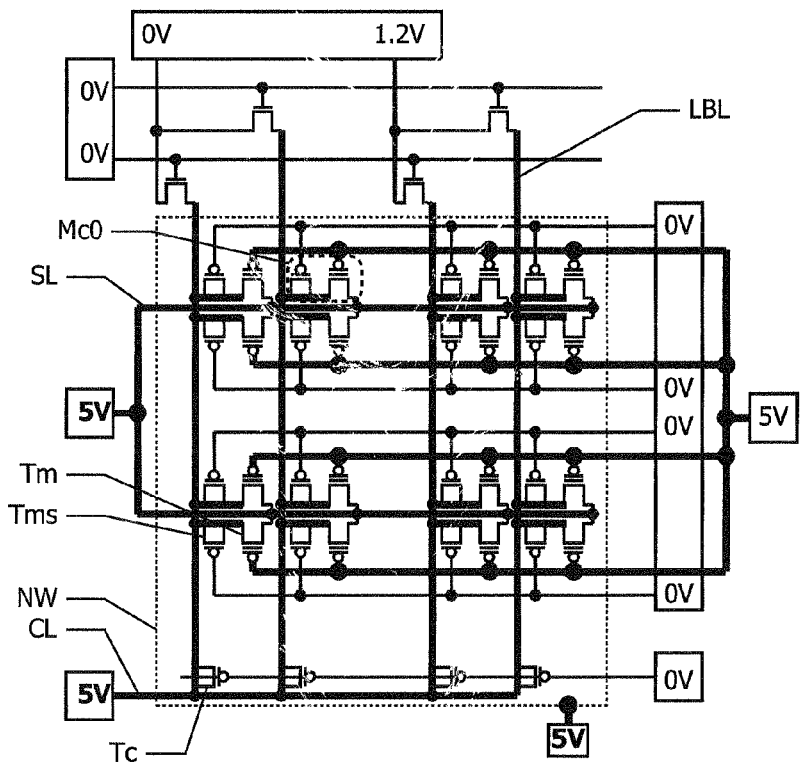

At time t3 in FIG. 15, 5 V is applied to the source line SL, charging line CL, and n-type well NW. As illustrated in FIG. 16B, the local bit lines LBL are precharged at 5 V through the charging transistors Tc. As the select transistors Tms are in the turned on state, the impurity diffusion layer between each select transistor Tms and memory transistor Tm (drain of the memory transistor Tm) is also precharged at 5 V.

Figure 16C:
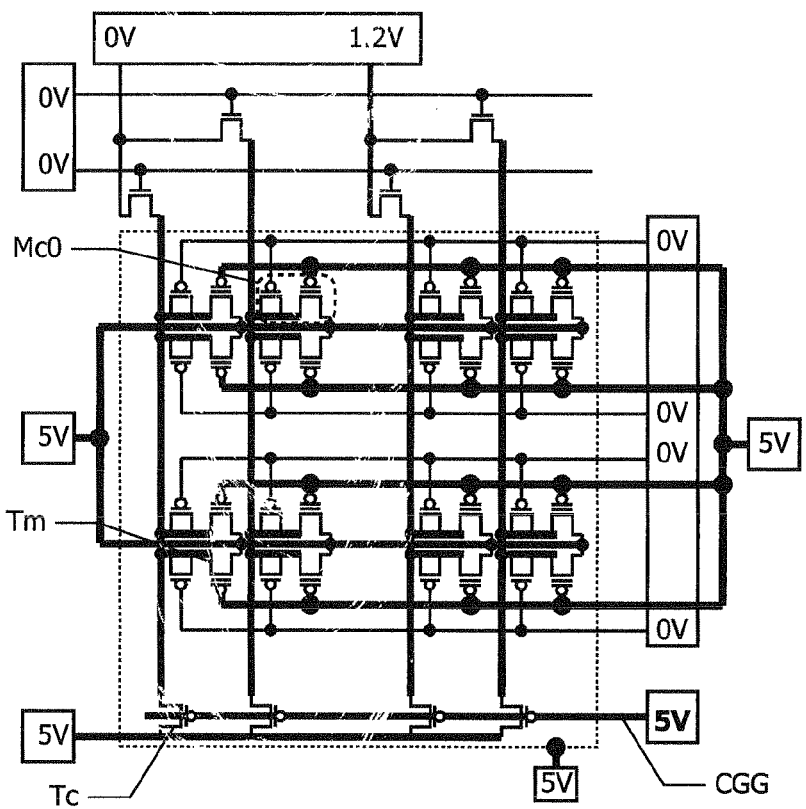
Figure 16D:
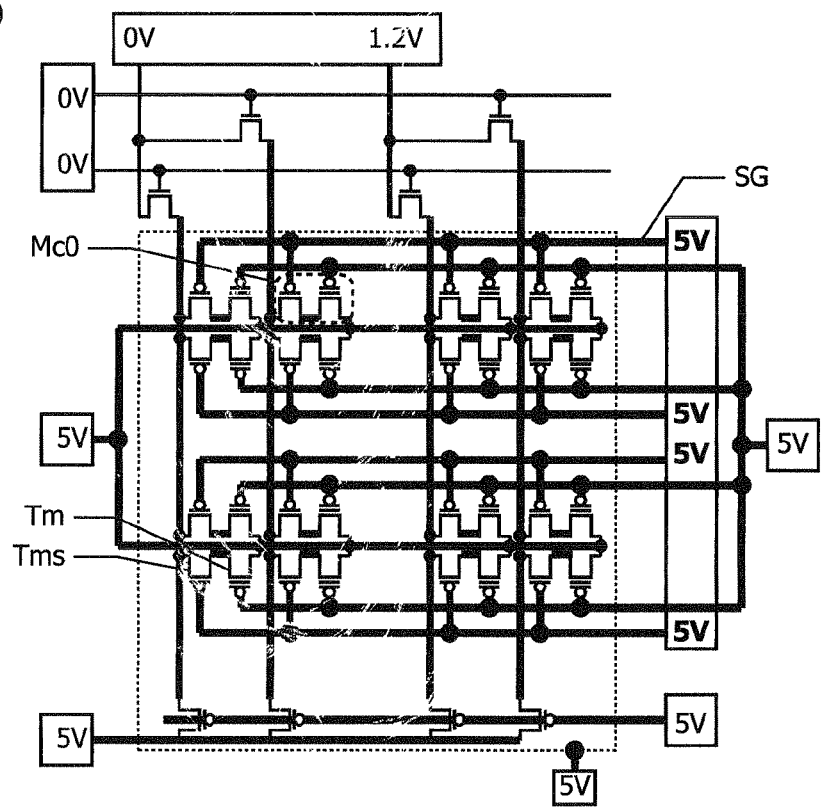

At time t4 in FIG. 15, 5 V is applied to the charging gate line CGG. As illustrated in FIG. 16C, as the charging transistor Tc is turned off, the local bit lines LBL are brought into floating state. With no flows of charges, the electric potential in the local bit lines LBL and the electric potential in the drain of each memory transistor Tm are maintained at 5 V.

At time t5 in FIG. 15, 5 V is applied to all select gate lines SG. As each select transistor Tms is turned off, the drain of each memory transistor Tm is brought into floating state. With no flows of charges, the electric potential in the drain of each memory transistor Tm is maintained at 5 V.

Figure 16E:
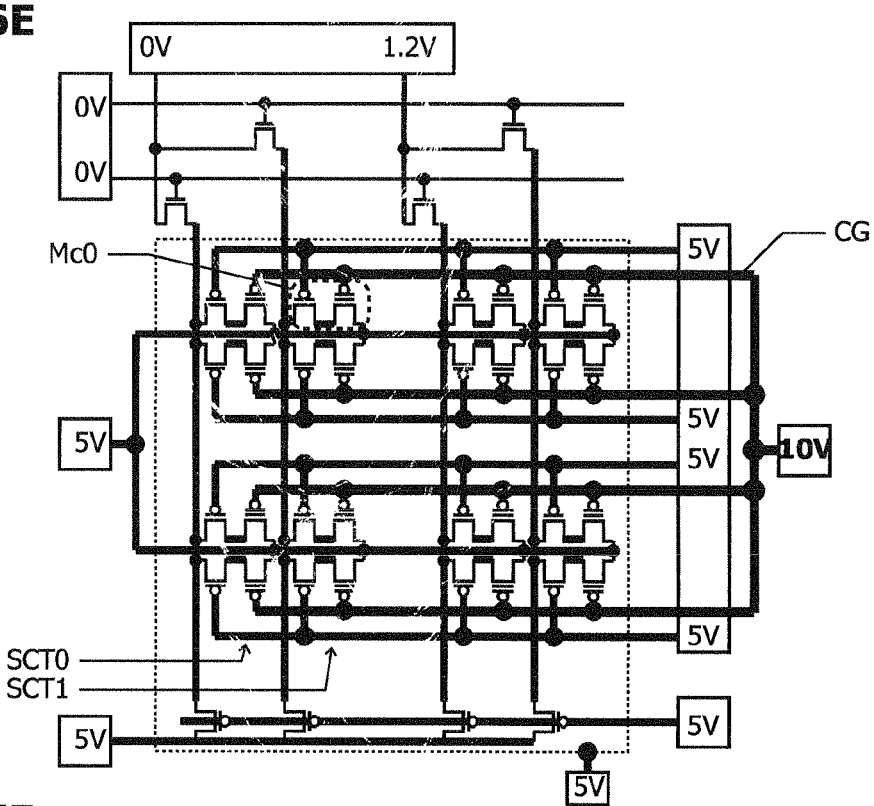

At time t6 in FIG. 15, 10 V is applied to the control gate lines CG. In FIG. 16E, 10 V is applied to the control gate lines CG.

Figure 16F:
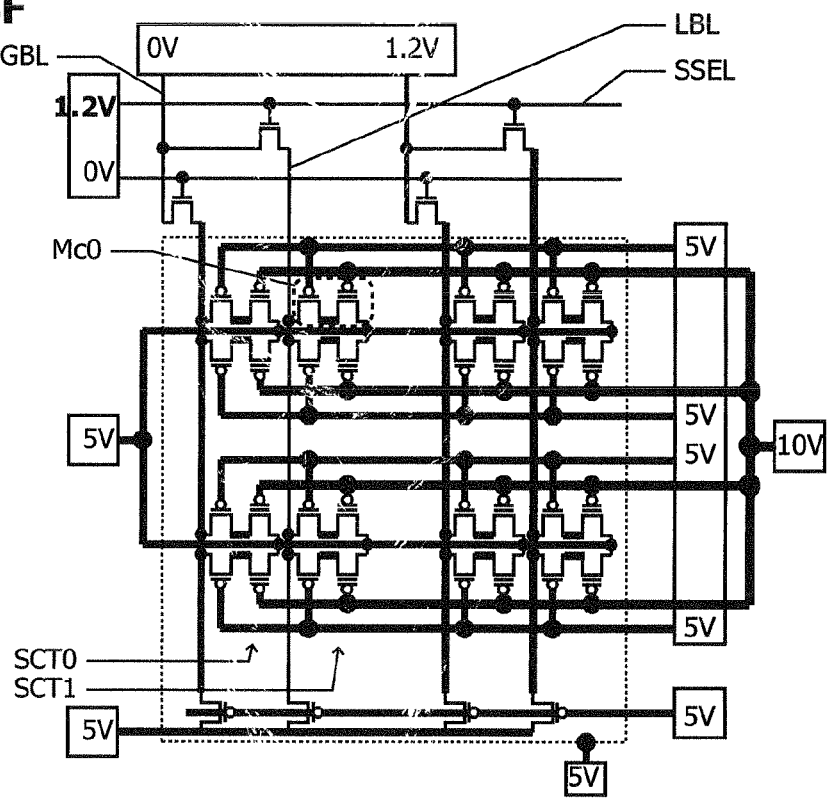

At time t7 in FIG. 15, 1.2 V is applied to the sector select line SSEL for the sector 1, which contains the selected memory cell Mc0. As illustrated in FIG. 16F, the local bit line LBL for the sector 1, which is connected to the global bit line GBL set to a voltage of 0 V, (the local bit line connected to the selected memory cell Mc0) is discharged to bring its electric potential to 0 V. The electric potential in other local bit line LBL (non-selected local bit line) is maintained at 5 V.

Figure 16G:
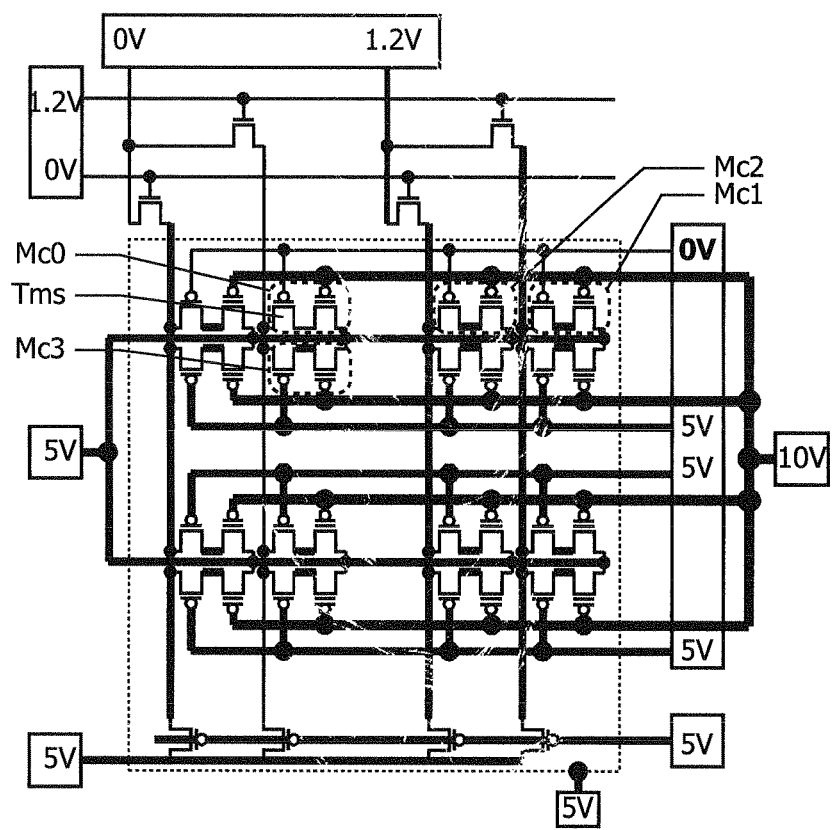

At time t8 in FIG. 15, the voltage applied to the select gate line (selected select gate line) SG in the row that contains the selected memory cell Mc0 is returned to 0 V. As illustrated in FIG. 16G, the select transistor Tms in the selected memory cell Mc0 is turned on to reduce the drain voltage of the memory transistor Tm down to 0 V.

Figure 17A:
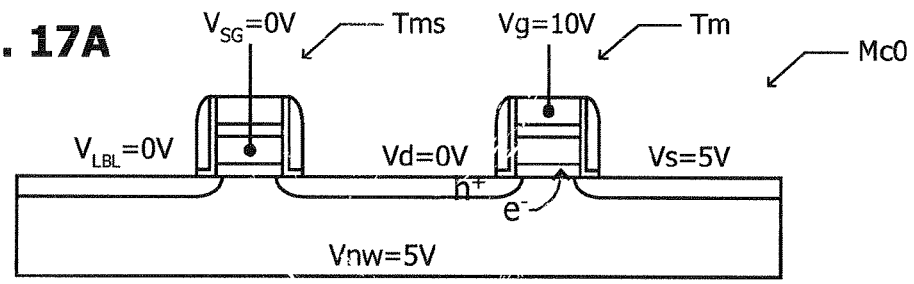
FIG. 17A-17D are cross sections illustrating the voltage application state of a memory transistor during write operation of the non-volatile semiconductor memory according to Embodiment 3.

FIG. 17A illustrates the voltage application state in the two memory transistors in the selected memory cell Mc0. As the drain voltage Vd of the memory transistor Tm reaches 0 V, electron-hole pairs are generated at the interface between the n-type well and the drain by inter-band tunneling. Since a voltage of 10 V, which is higher than the voltage applied to the n-type well, is applied to the control gate, the electrons generated are injected into the floating gate of the memory transistor Tm. Thus, datum is written in the selected memory cell Mc0.

Figure 17B:
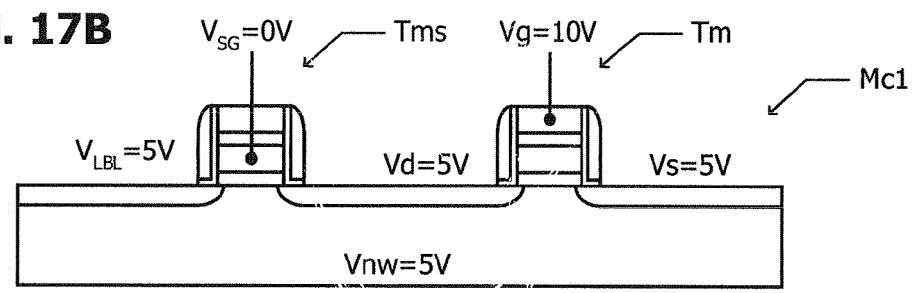
Figure 17C:
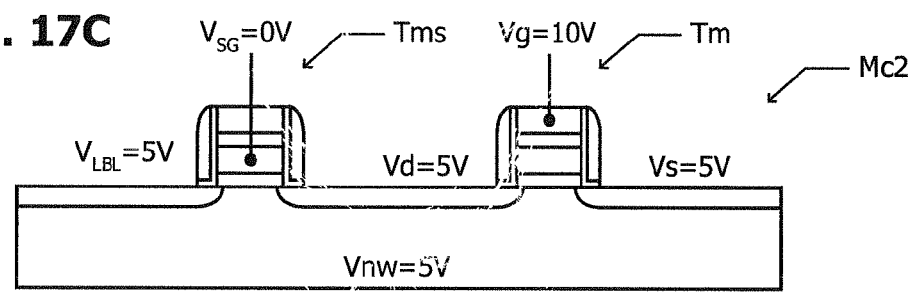

FIG. 17B illustrates the voltage application state in the two memory transistors in another memory cell Mc1 that belongs to the same row and the same sector (sector 1) as the selected memory cell Mc0. FIG. 17C illustrates the voltage application state in the two memory transistors in a memory cell Mc2 that belongs to the same row as the selected memory cell Mc0 and to a different sector (sector 0). In any memory cell, the voltage applied to the corresponding local bit line LBL is maintained at 5 V, and the drain voltage Vd of the memory transistor Tm is maintained at 5 V. The drain voltage Vd is equal to the n-type well's electric potential Vnw, failing to cause inter-band tunneling.

Figure 17D:
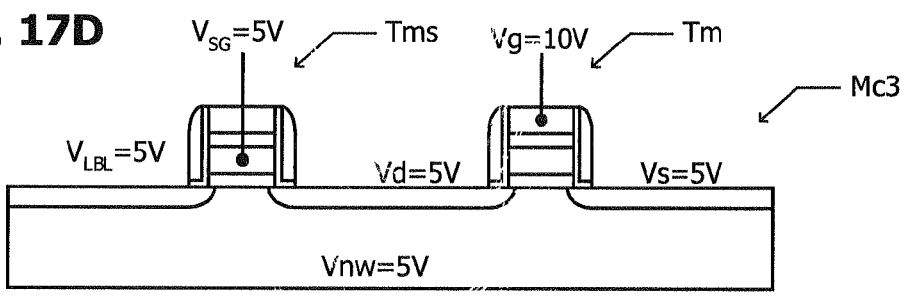

FIG. 17D illustrates the voltage application state in the two memory transistors in another memory cell Mc3 that belongs to the same column as the selected memory cell Mc0. Although the voltage applied to the corresponding local bit line LBL is 0 V, the select transistor Tms is in the turned off state to maintain the drain voltage Vd of the memory transistor Tm at 5 V. The drain voltage Vd is equal to the n-type well electric potential Vnw, failing to cause inter-band tunneling.

At time t9 in FIG. 15, 5 V is applied to the selected select gate line SG. At time t10, the voltage applied to the control gate lines CG is returned to 5 V. At time t11, the voltage applied to the selected sector select line SSEL is returned to 0 V. At time t12, the voltages applied to the select gate lines SG, control gate lines CG, charging gate line CGG, source line SL, charging line CL, and n-type well NW are returned to 0 V. As the charging transistors Tc are turned on as illustrated in FIG. 14, 0 V is applied to the local bit lines LBL. At time t13, the data signal applied to the global bit lines GBL is returned to 0 V.

Figure 18A:
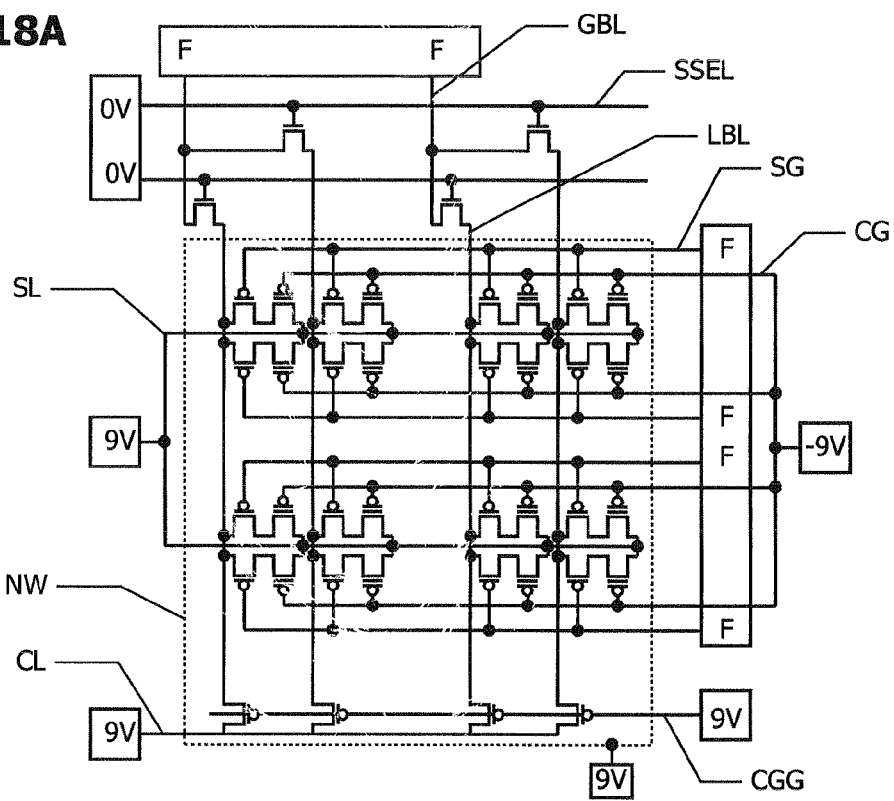
FIGS. 18A and 18B are equivalent circuit diagrams illustrating the voltage application state during erase operation and write operation, respectively, of the non-volatile semiconductor memory according to Embodiment 3.

As illustrated in FIG. 18A, during erase process, the global bit lines GBL and the select gate lines SG are brought into floating state, and 0 V is applied to the sector select lines SSEL, 9 V is applied to the source line SL, charging line CL, n-type well NW, and charging gate line CGG, and −9 V is applied to the control gate lines CG. Accordingly, the electrons stored in the floating gate of the memory transistor Tm are extracted into the substrate.

Figure 18B:
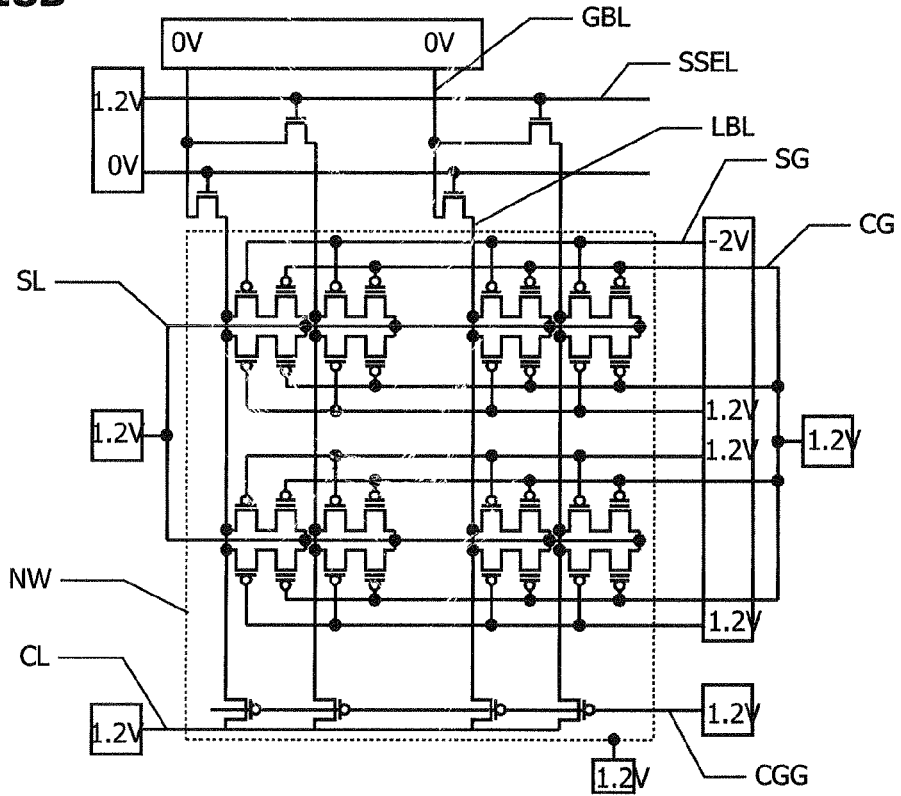

As illustrated in FIG. 18B, during the read process, 1.2 V is applied to the sector select line SSEL corresponding to the sector that contains the selected memory cell, and 0 V is applied to the other sector select line SSEL. A voltage of 1.2 V is applied to the source line SL, charging line CL, n-type well NW, charging gate line CGG, and control gate lines CG. A voltage of 0 V is applied to the global bit lines GBL. A voltage of −2 V is applied to the select gate line SG for the row that contains the selected memory cell, and 1.2 V is applied to the other select gate lines SG.

A relatively large electric current flows when the memory transistor Tm in the selected memory cell is in written state, and only a relatively small electric current flows when it is in erased state. Datum is read out as this electric current is detected by the sense amplifier in the bit line control circuit 30.

The bit line control circuit 30 can be formed of low voltage transistors in Embodiment 3 as well. Thus, the chip area can be reduced, and the read speed can be increased as in the case of Embodiment 1.

Embodiment 4

Figure 19:
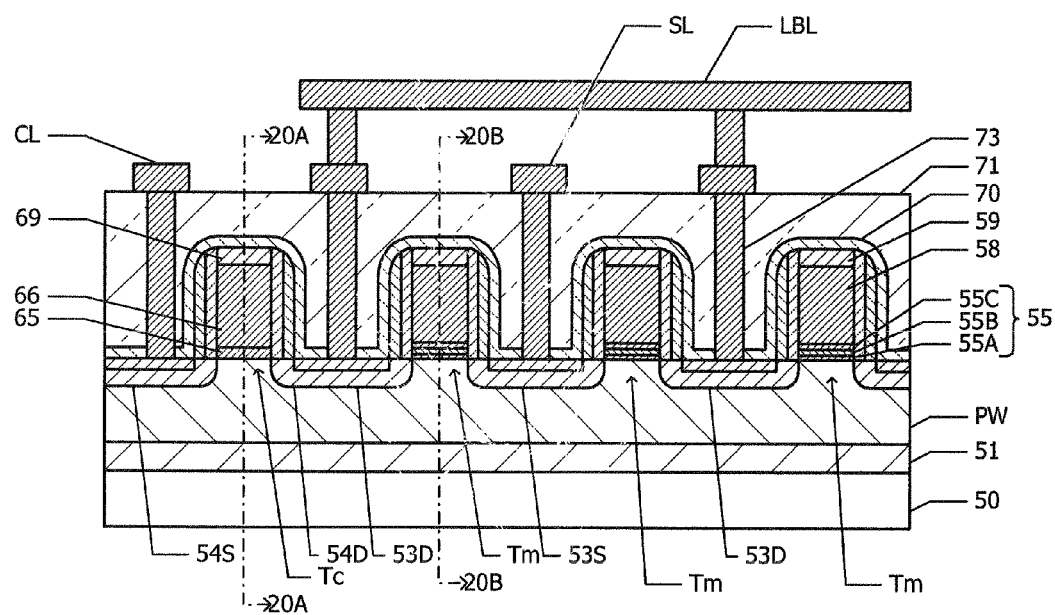
FIG. 19 is a cross section of the non-volatile semiconductor memory according to Embodiment 4.

FIG. 19 is a cross section of the non-volatile semiconductor memory according to Embodiment 4. The equivalent circuit diagram of the non-volatile semiconductor memory according to Embodiment 4 is identical to that of the non-volatile semiconductor memory according to Embodiment 1 illustrated in FIG. 1. Description will be made mainly on different portions from Embodiment 1, and description will be omitted on similar portions as in Embodiment 1.

FIG. 19 is a cross section along the column direction of the circuit illustrated in FIG. 1, which corresponds to the cross section illustrated in FIG. 6 for Embodiment 1. A floating gate type transistor is used for the memory transistor Tm in Embodiment 1. SONOS type transistor is used in Embodiment 4, instead. The gate insulation film 55 of the memory transistors Tm has a three-layered structure composed of a silicon nitride film 55B sandwiched between silicon oxide films 55A and 55C. The gate insulation film 65 of the charging transistor Tc is formed of silicon oxide During the write process, electric charges are injected into the silicon nitride film 55B.

Figure 20A:
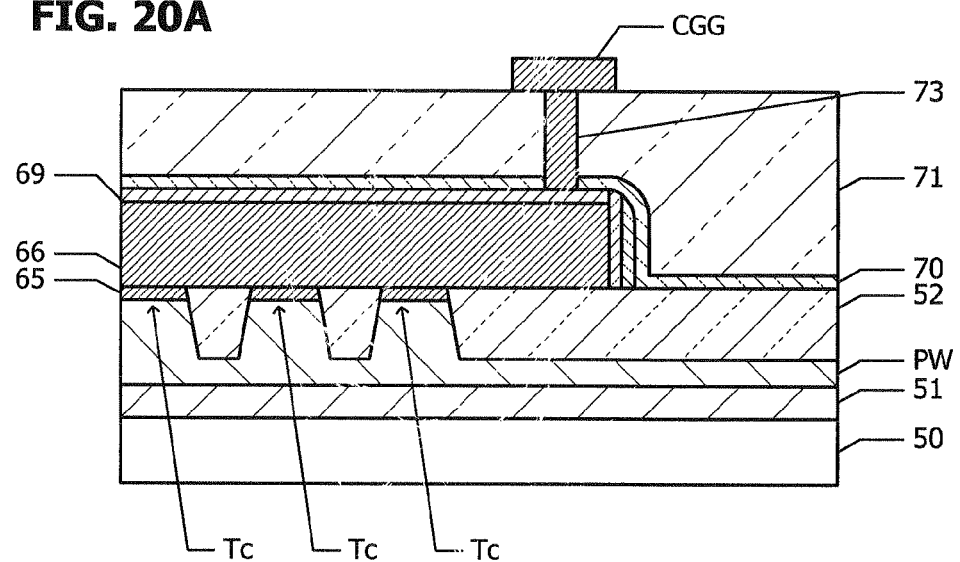
FIGS. 20A and 20B are cross sections along the dashed-dotted lines 20A-20A and 20B-20B, respectively, defined in FIG. 19.
Figure 20B:
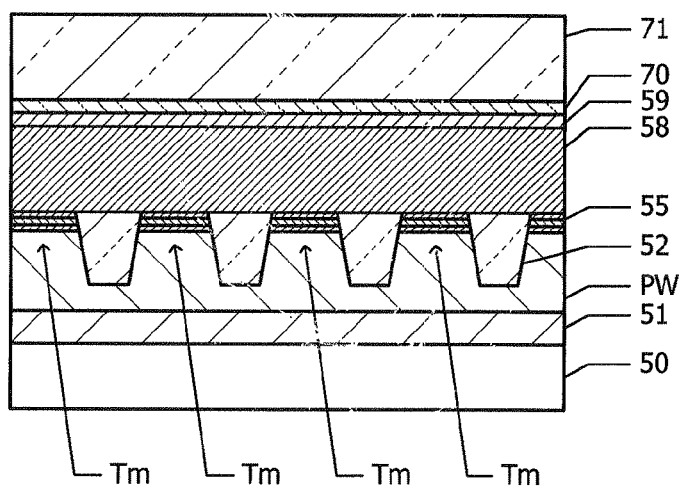

FIGS. 20A and 20B are cross sections along the dashed-dotted line 20A-20A and the dashed-dotted line 20B-20B, respectively, in FIG. 19. FIGS. 20A and 20B are cross sections corresponding to those illustrated in FIGS. 7A and 7B, respectively, for Embodiment 1.

As illustrated in FIG. 20A, the gate electrode 66 of the charging transistors Tc is shared by multiple charging transistors Tc. A metal silicide film 69 is formed on the top face of the gate electrode 66. The gate electrode 66 is connected to the charging gate line CGG formed on the interlayer insulation film 71, through the metal silicide film 69 and the electrically conductive plug 73.

As illustrated in FIG. 20B, the gate electrode 58 of the memory transistors Tm is shared by multiple memory transistors Tm in a row. A metal silicide film 59 is formed on the top face of the gate electrode 58.

The write, erase, and read processes of the non-volatile semiconductor memory according to Embodiment 4 are identical to those of the non-volatile semiconductor memory according to Embodiment 1.

Figure 21:
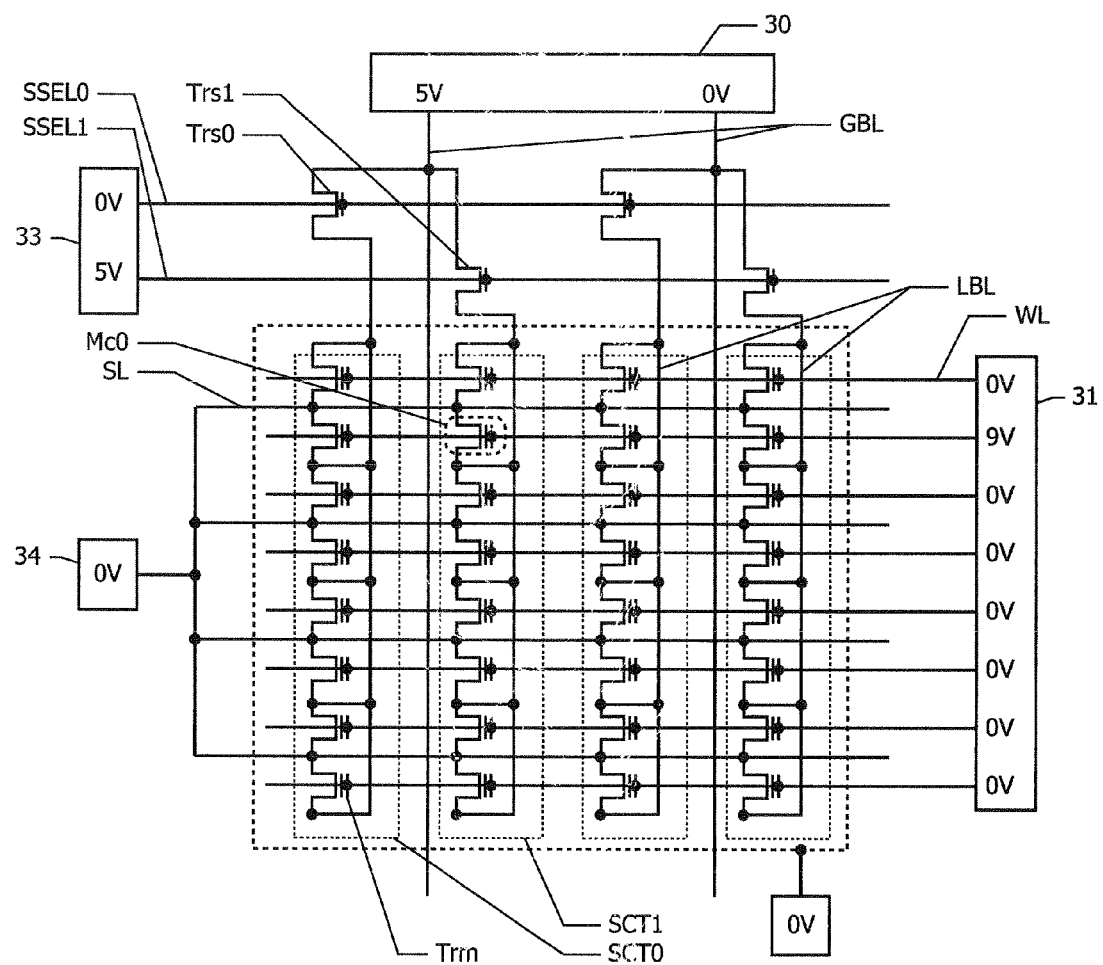
FIG. 21 is an equivalent circuit diagram of the non-volatile semiconductor memory according to a comparative example of Embodiment 4.

FIG. 21 is an equivalent circuit diagram of the SONOS type non-volatile semiconductor memory according to the comparative example. The charging line CL, charging transistor Tc, and charging gate line CGG illustrated in FIG. 1 are not provided in this comparative example.

During the write process, 5 V, 0 V, and 9 V are applied to the global bit line GBL, source line SL, and word line WL that are connected to the selected memory cell Mc0.

Figure 22A:
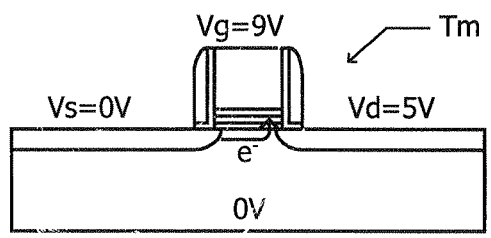
FIG. 22A, 22B, and 22C are a cross section illustrating the voltage application state in a memory transistor during write operation of the non-volatile semiconductor memory according to the comparative example, a cross section illustrating the voltage application state in a memory transistor during read operation of the non-volatile semiconductor memory according to the comparative example or Embodiment 4, and a cross section illustrating the voltage application state in a memory transistor during write operation of the non-volatile semiconductor memory according to Embodiment 4, respectively.

FIG. 22A illustrates the voltage application state in the memory transistor Tm in the selected memory cell Mc0 according to the comparative example. The source voltage Vs is set at 0 V, the drain voltage Vd is set at 5 V, and the gate voltage Vg is set at 9 V. The electrons accelerated from the source toward the drain are injected into the silicon nitride film 55B of the gate insulation film near the drain-side end of the channel.

Figure 22B:
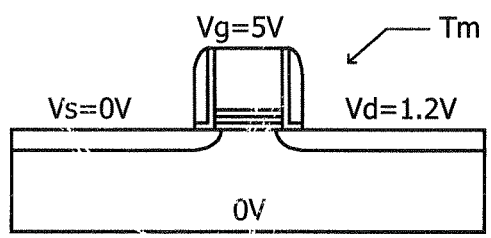

FIG. 22B illustrates the voltage application state in the memory transistor Tm during the read process. The source voltage Vs is set at 0 V, the drain voltage Vd is set at 1.2 V, and the gate voltage Vg is set at 5 V. The drain voltage Vd is higher than the source voltage Vs during both the write process and the read process. This reading method is called forward reading.

Figure 22C:
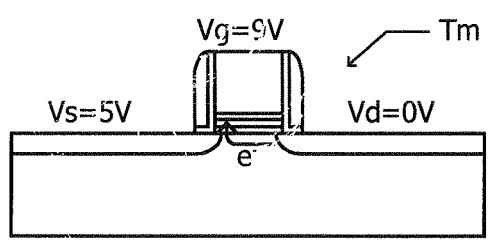

FIG. 22C illustrates the voltage application state in the memory transistor Tm in the selected memory cell during the write process of the non-volatile semiconductor memory according to Embodiment 4. As in the case of Embodiment 1 illustrated in FIG. 4A, the source voltage Vs is set at 5 V, the drain voltage Vd is set at 0 V, and the gate voltage Vg is set at 9 V during the write process. Accordingly, the electrons accelerated from the drain toward the source are injected into the gate insulation film near the source-side end of the channel.

The voltage application state during the read process of the non-volatile semiconductor memory according to Embodiment 4 is identical to that illustrated in FIG. 22B. As illustrated in FIG. 22B and 22C, the voltage relation between the source and the drain is reversed for the write and read processes. This reading method is called reverse reading.

The difference in threshold voltage between the write state and the erased state is small for forward reading. In contrast, the difference in threshold voltage between the write state and the erased state is large in the case of reverse reading. A larger number of electric charges have to be injected into the gate insulation film if a threshold voltage shift required for reverse reading is to be achieved during forward reading. An increase in electric charge will cause a decrease in reliability.

In the non-volatile semiconductor memory according to Embodiment 4, a larger threshold voltage shift can be achieved with a smaller electric charge injection rate as compared with the comparative example, making it possible to ensure a high reliability. Further, the chip area can be reduced and the read speed can be increased as in the case of Embodiment 1.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What are claimed are:

1. A non-volatile semiconductor memory comprising:
   a global bit line;
   a local bit line, that defines a sector, connected to the global bit line;
   a sector select transistor connected to the local bit line;
   a sector select line, that controls on/off state of the sector select transistor, connected to the sector select transistor;
   a word line that intersects the local bit line;
   a source line;
   a memory cell located at intersection between the local bit line and the word line, the memory cell connecting the source line with the local bit line;
   an n-channel memory transistor, that is turned on/off by the word line, included in the memory cell;
   a charging line to which a precharge voltage is applied;
   a charging transistor connected to the local bit line and the charging line;
   a charging gate line that controls on/off state of the charging transistor; and
   control circuits that include a bit line control circuit that controls electric signal applied to the global bit line, a sector control circuit that controls electric signal applied to the sector select line, a word line control circuit that controls electric signal applied to the word line, a source line control circuit that controls electric signal applied to the source line, a charging line control circuit that controls electric signal applied to the charging line, and a charging gate line control circuit that controls electric signal applied to the charging gate line.

2. The non-volatile semiconductor memory as defined in claim 1, wherein the bit line control circuit includes a first transistor,
the word line control circuit includes a second transistor,
the first transistor includes a first gate insulation film,
the second transistor includes a second gate insulation film, and
the first gate insulation film is thinner than the second gate insulation film.

3. The non-volatile semiconductor memory as defined in claim 1, wherein the sector control circuit includes a third transistor,
the word line control circuit includes a second transistor,
the third transistor includes a third gate insulation film,
the second transistor includes a second gate insulation film, and
the third crate insulation film is thinner than the second gate insulation film.

4. The non-volatile semiconductor memory as defined in claim 1, wherein the bit line control circuit, during the write process, applies data signal to the plurality of global bit line, applies the precharge voltage to the local bit line by turning off the sector select transistor and turning on the charging transistor, and causes an electric current to flow in the memory cell, by applying word line select signal to the word line, turning on the sector select transistor, and discharging the local bit line, so that datum is written to the memory cell.

5. The non-volatile semiconductor memory as defined in claim 4, wherein the charge line control circuit applies a precharge voltage to the charging line after turning on the charging transistor, before turning on the sector select transistor.

6. The non-volatile semiconductor memory as defined in claim 5, wherein a source voltage applied to the source lines is equal to the precharge voltage applied to the charging line.

7. A non-volatile semiconductor memory comprising:
a global bit line;
a local bit line, that defines a sector, connected to the global bit line;
a sector select transistor connected to the local bit line;
a sector select line, that controls on/off state of the sector select transistor, connected to the sector select transistor;
a row select line that intersects the local bit line;
a source line;
a memory cell located at intersection between the local bit line and the row select line, the memory cell connecting the source line with the local bit line, and being controlled conduction state of the memory cell by the row select line;
a charging line to which a precharge voltage is applied;
a charging transistor connected to the local bit line and the charging line;
a charging gate line that controls on/off state of the charging transistor; and
control circuits that include a bit line control circuit that controls electric signal applied to the global bit line, a sector control circuit that controls electric signal applied to the sector select line, a row select line control circuit that controls electric signal applied to the row select line, a source line control circuit that controls electric signal applied to the source line, a charging line control circuit that controls electric signal applied to the charging line, and charging gate line control circuit that controls electric signal applied to the charging gate line;
wherein the charging line control circuit, during the write process, applies the precharge voltage to the charging line, the charging gate line control circuit applies electric signal to turn on the charging transistor, and applies the precharge voltage to the local bit line, followed by turning on the sector select transistor to discharge the local bit line.

8. The non-volatile semiconductor memory as defined in claim 7, wherein the bit line control circuit includes a first transistor,
the row select line control circuit includes a second transistor,
the first transistor includes a first gate insulation film,
the second transistor includes a second gate insulation film, and
the first gate insulation film is thinner than the second gate insulation film.

9. The non-volatile semiconductor memory as claimed in claim 7, wherein the sector control circuit includes a third transistor,
the row select line control circuit includes a second transistor,
the third transistor includes a third gate insulation film,
the second transistor includes a second gate insulation film, and
the third gate insulation film is thinner than the second gate insulation film.

10. The non-volatile semiconductor memory as defined in claim 7, wherein the memory cell comprises a select transistor and a memory transistor,
the memory transistor includes a drain connected to the local bit line through the select transistor,
the select transistor is turned on/off by the row select line, and
the memory transistor includes a source connected to the source line.

* * * * *